(12) United States Patent
Yang et al.

(10) Patent No.: US 11,428,765 B2
(45) Date of Patent: Aug. 30, 2022

(54) MRI HEAD COIL COMPRISING AN OPEN SHIELD

(71) Applicant: Quality Electrodynamics, LLC, Mayfield Village, OH (US)

(72) Inventors: Xiaoyu Yang, Indiana, PA (US); Tsinghua Zheng, Chesterland, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 79 days.

(21) Appl. No.: 17/007,378

(22) Filed: Aug. 31, 2020

(65) Prior Publication Data

US 2021/0132169 A1    May 6, 2021

Related U.S. Application Data

(60) Provisional application No. 62/930,738, filed on Nov. 5, 2019.

(51) Int. Cl.
*G01R 33/422* (2006.01)
*G01R 33/34* (2006.01)
*G02C 11/08* (2006.01)

(52) U.S. Cl.
CPC ..... *G01R 33/422* (2013.01); *G01R 33/34076* (2013.01); *G02C 11/08* (2013.01)

(58) Field of Classification Search
CPC ................. G01R 33/34076; G01R 33/422
See application file for complete search history.

(56) References Cited

U.S. PATENT DOCUMENTS

| 4,825,162 A | 4/1989 | Roemer et al. |
| 6,029,082 A * | 2/2000 | Srinivasan ....... G01R 33/34046 324/318 |
| 7,202,668 B2 | 4/2007 | Ludwig et al. |
| 7,508,210 B2 | 3/2009 | Morich et al. |

(Continued)

OTHER PUBLICATIONS

Finnerty et al. "A 7-Tesla High Density Transmit with 28-Channel Receive-Only Array Knee Coil." Proc Intl. Soc. Mag. Reson. Med. 18 (2010), published in 2010.

(Continued)

*Primary Examiner* — Jay Patidar
(74) *Attorney, Agent, or Firm* — Eschweiler & Potashnik, LLC

(57) ABSTRACT

Various embodiments of the present disclosure are directed towards a magnetic resonance imaging (MRI) head coil comprising an open shield. A transmit coil surrounds a phased array receive coil and comprises a resonant birdcage structure. The resonant birdcage structure comprises multiple transmit rungs spaced in a first closed path, and inter-rung spacing at one or more first locations on the first closed path is greater than at a remainder of the first closed path. The open shield surrounds the transmit coil and comprises a non-resonant birdcage structure. The non-resonant birdcage structure comprises multiple shield rungs spaced in a second closed path. The shield rungs are elongated in parallel with the transmit rungs, and inter-rung spacing at one or more second locations on the second closed path is greater than at a remainder of the second closed path. Further, the second location(s) respectively and radially border the first location(s).

20 Claims, 22 Drawing Sheets

(56) References Cited

U.S. PATENT DOCUMENTS

| | | | | |
|---|---|---|---|---|
| 8,055,326 B1* | 11/2011 | Dworkin | ............... | G01R 33/307 |
| | | | | 600/422 |
| 8,294,460 B2* | 10/2012 | Driemel | ................ | A61B 5/055 |
| | | | | 324/307 |
| 2009/0267606 A1* | 10/2009 | Lazar | ............... | G01R 33/34076 |
| | | | | 324/318 |
| 2012/0268132 A1* | 10/2012 | Zhu | ................... | G01R 33/3692 |
| | | | | 324/322 |
| 2018/0313918 A1* | 11/2018 | Yang | ................ | G01R 33/34007 |
| 2019/0377039 A1* | 12/2019 | Loew | ................ | G01R 33/3657 |

OTHER PUBLICATIONS

Lazar et al. "Integrated RF Birdcage Head Coil for 7T MRI." Proc. Intl. Soc. Mag. Reson. Med. 15 (2007), published in 2007.
Chen et al. "A 7T 8 channel transmit-receive dipole array for head imaging: dipole element and coil evaluation." Proc. Intl. Soc. Mag. Reson. Med. 22 (2014), published in 2014.
Muhibbullah et al. "Frequency dependent power and energy flux density equations of the electromagnetic wave." Results in Physics 7 (2017) 435-439, published on Jan. 6, 2017.
Finnerty et al. "A 7-Tesla Transmit with 32-Channel Receive-Only Array Head Coil for fMRI." Proc. Intl. Soc. Mag. Reson. Med. 24 (2016), published in 2016.
Amadon et al. "Comparison between commercial RF head coils and a new hybrid transmit-array coil based on 12 transmit elements and 22 receive elements for an 8-channel transmission system at 7 T." Proc. Intl. Soc. Mag. Reson. Med. 24 (2016), published in 2016.

* cited by examiner

MRI HEAD COIL COMPRISING AN OPEN SHIELD

REFERENCE TO RELATED APPLICATION

This application claims the benefit of U.S. Provisional Application No. 62/930,738, filed on Nov. 5, 2019, the contents of which are incorporated by reference in their entirety.

BACKGROUND

Magnetic resonance imaging (MRI) coils employing phased array technology provide large-coil-like signal penetration while having the high signal performance of a small coil at shallow depths. As such, phased array MRI coils are widely used for imaging different regions of the human anatomy. One such region is the head.

Because many patients are claustrophobic, it is important to design an MRI head coil to be clinically friendly. For example, it is important for an MRI head coil to have openings for the eyes and, in some embodiments, the mouth to mitigate claustrophobia. MRI systems at 7 tesla (T) and above generally do not have built-in transmit (Tx) coils (e.g., whole body coils (WBCs)). Therefore, an MRI head coil designed for 7T and above may include both a phased array receive (Rx) coil and a Tx coil. Elements of a phased array receive coil are generally loops, such that a clinically friendly design may be achieved by creating openings through the loops for the eyes and, in some embodiments, the mouth. However, achieving a clinically friendly design for the transmit coil may prove challenging at 7T and above.

A transmit coil generally has three resonance losses: 1) resistive loss from a conductor of the transmit coil; 2) scanning object loss from eddy currents induced in the scanning object; and 3) radiation loss from radiofrequency (RF) current flowing in the transmit coil. Further, the radiation loss is proportional to the square of the frequency of the RF current flowing in the transmit coil. Accordingly, at the Larmor frequency for 7T (e.g., approximately 300 megahertz (MHz)) and above, the radiation loss is or is becoming dominant.

One type of coil suitable for use as a transmit coil is a birdcage coil. Because of the large radiation loss at 7T and above, the quality (Q) factor of the birdcage coil may become less than one. At a Q factor less than one, the birdcage coil may no longer resonate and may hence be unsuitable for use as a transmit coil. To mitigate this, a conductive RF shield may be arranged outside the birdcage coil to contain radiation. This improves the Q factor and hence allows the birdcage coil to resonate. However, achieving a clinically friendly design of the transmit coil with the conductive RF shield may prove challenging because creating openings through the conductive RF shield for the eyes and, in some embodiments, the mouth reduces the effectiveness of the RF shield and hence degrades the Q factor.

Other types of coils suitable for use as a transmit coil include a transverse electromagnetic (TEM) resonator coil and a parallel transmission (pTx) coil. However, like the birdcage coil, a TEM resonator coil also depends on a conductive RF shield at 7T and above and hence a clinically friendly design may prove challenging. The pTx coil uses many loops for parallel transmission and does not depend upon a conductive RF shield at 7T and above. Therefore, a clinically friendly design may be achieved by creating openings through the loops for the eyes and, in some embodiments, the mouth. However, the pTx coil is expensive because of dependence on a large number of transmit RF chains and complicated controls.

As an alternative to including a transmit coil within an MRI head coil, a transmit antenna may be included. A transmit antenna does not depend upon a conductive RF shield at 7T and above and hence allows openings for the eyes and, in some embodiments, the mouth. However, in contrast with a transmit coil, the transmit antenna may have low transmit efficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 14A-14G illustrate schematic views of some different alternative embodiments of the transmit coil of FIGS. 13A-13D.

FIGS. 15A-15G illustrate schematic views of some different alternative embodiments of the open shield of FIGS. 13A-13D.

Figure 16A:
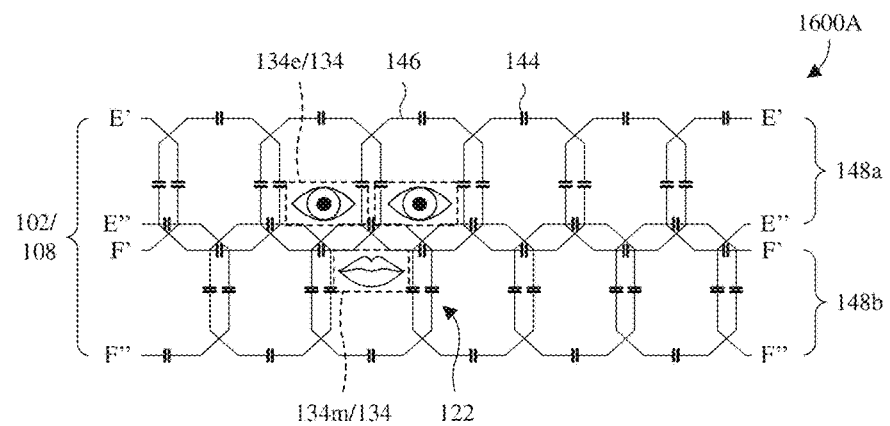
Figure 16B:
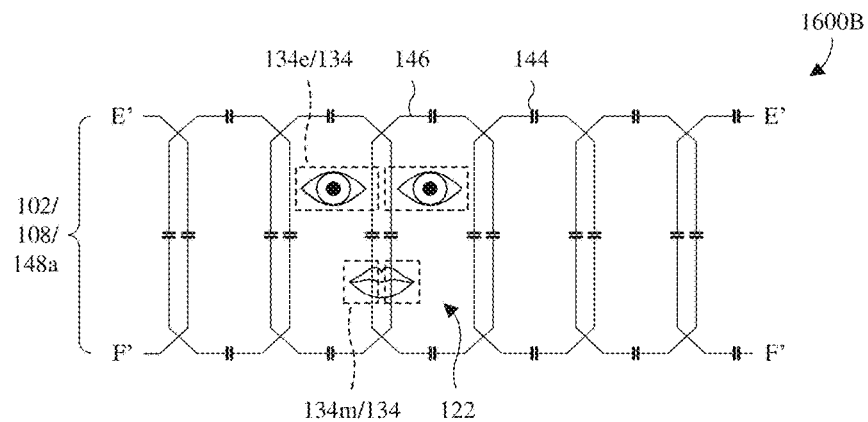
Figure 16C:
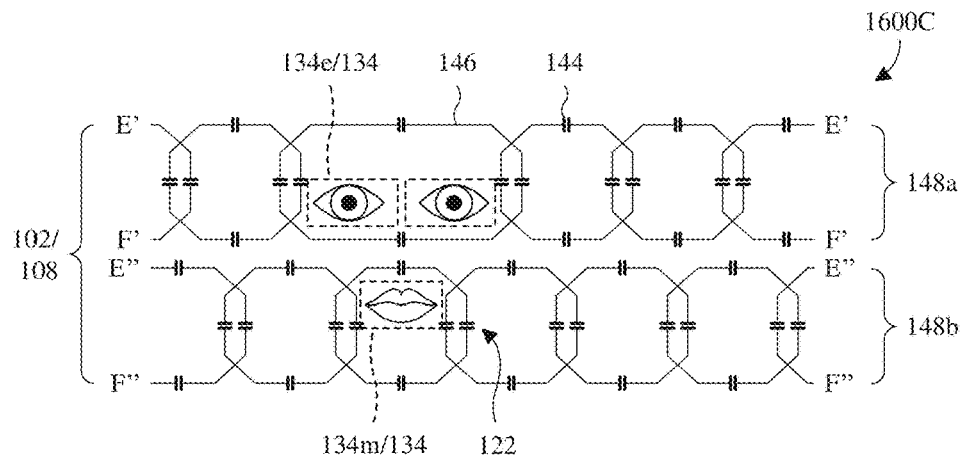
Figure 17A:
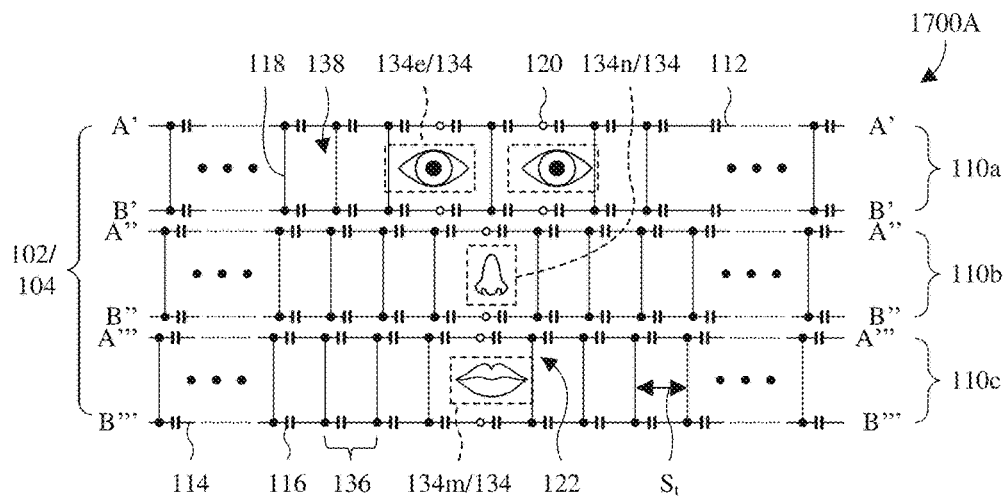
Figure 17B:
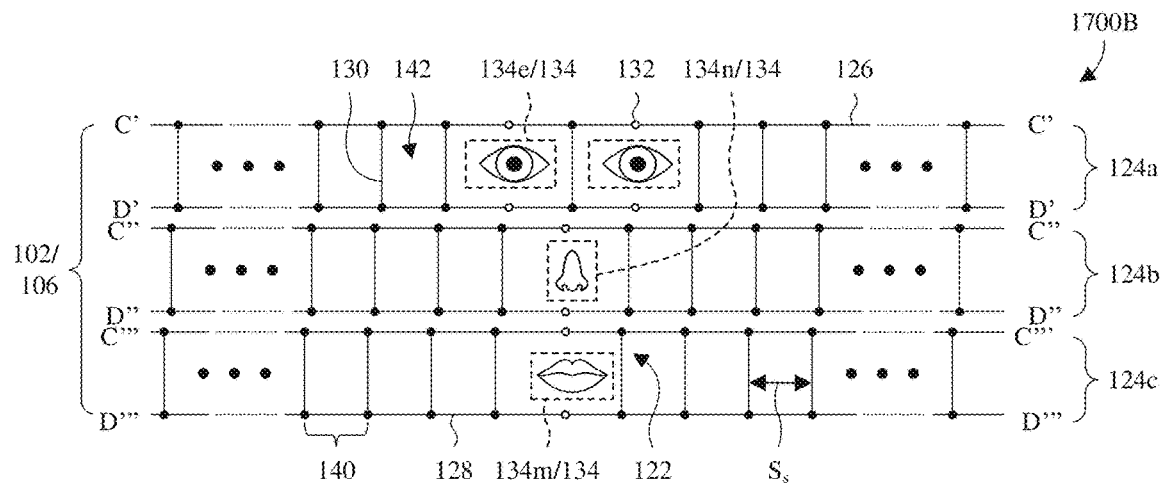
Figure 17C:
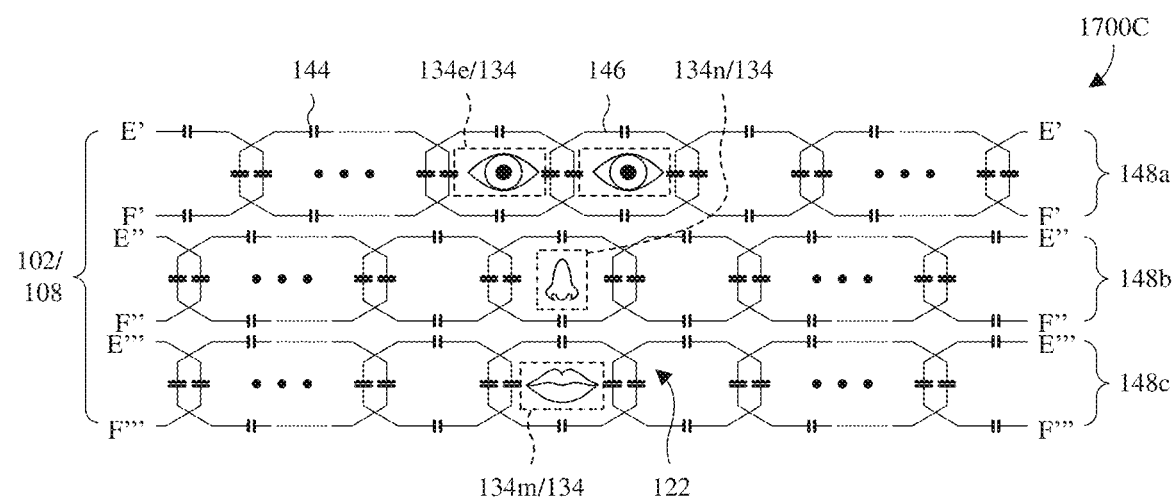
Figure 17D:
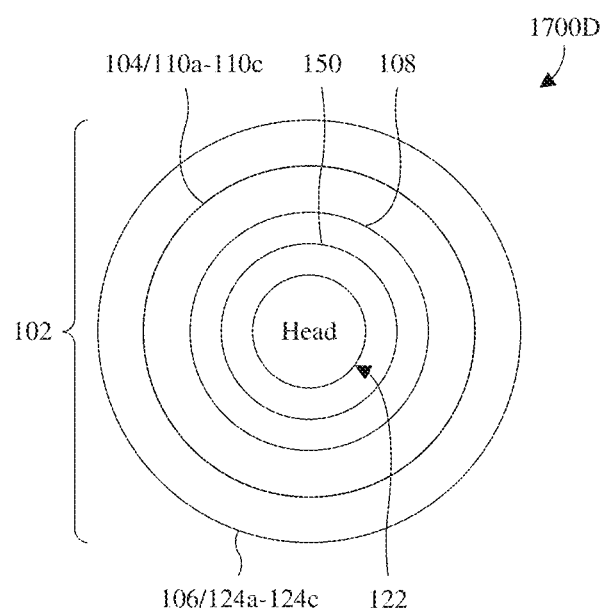

FIGS. 16A-16C illustrates schematic views of some different alternative embodiments of the phased array receive coil of FIGS. 13A-13D.

FIGS. 17A-17D illustrate various schematic views of some alternative embodiments of the MRI head coil of FIGS. 1A-1D in which the transmit coil and the open shield each have three birdcage structures and in which the phased array receive coil has three rows.

Figure 18:
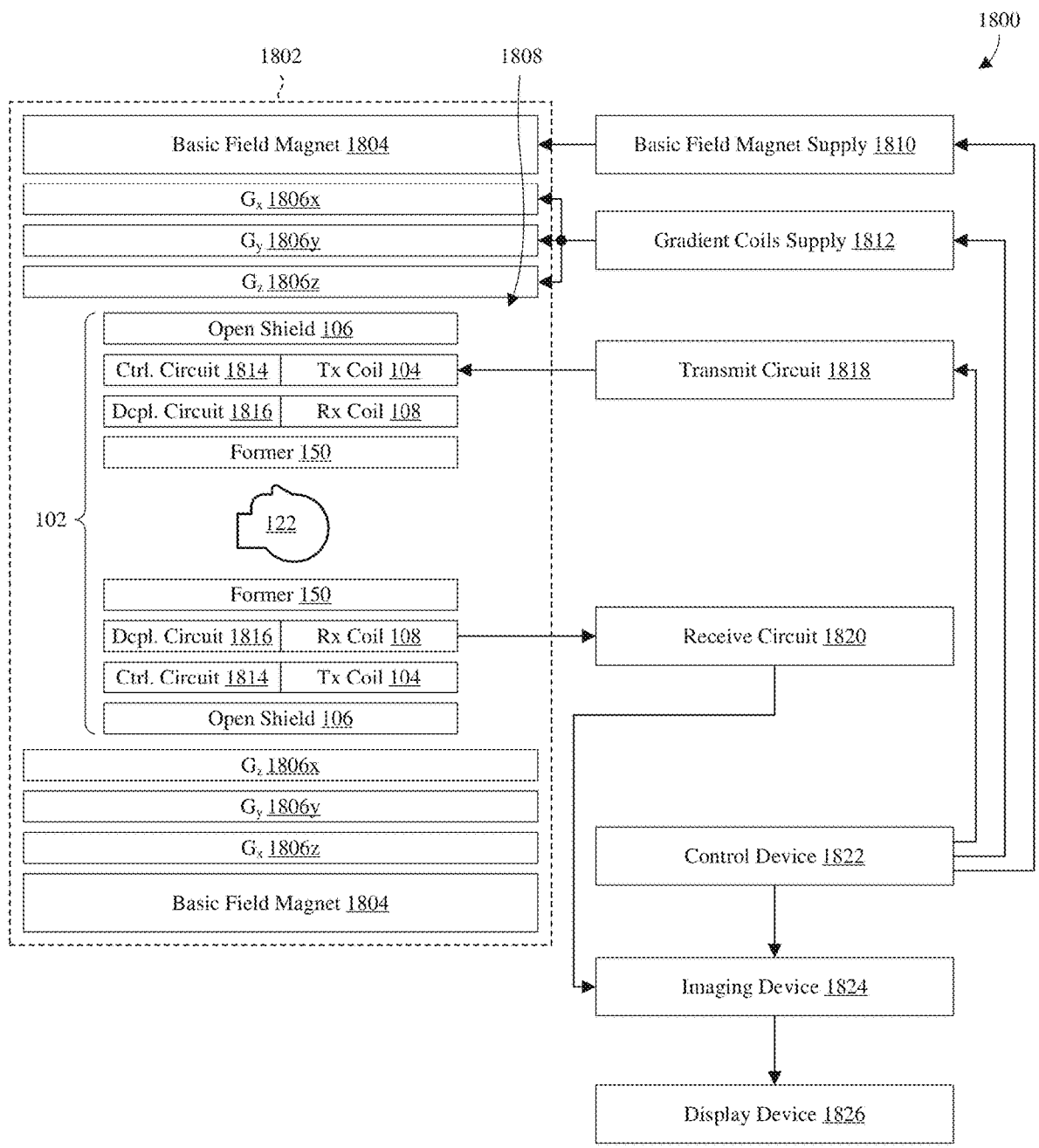

FIG. 18 illustrates a block diagram of some embodiments of an MRI system comprising an MRI head coil in which the MRI head coil comprises a transmit coil, an open shield, and a phased array receive coil.

Figure 19:
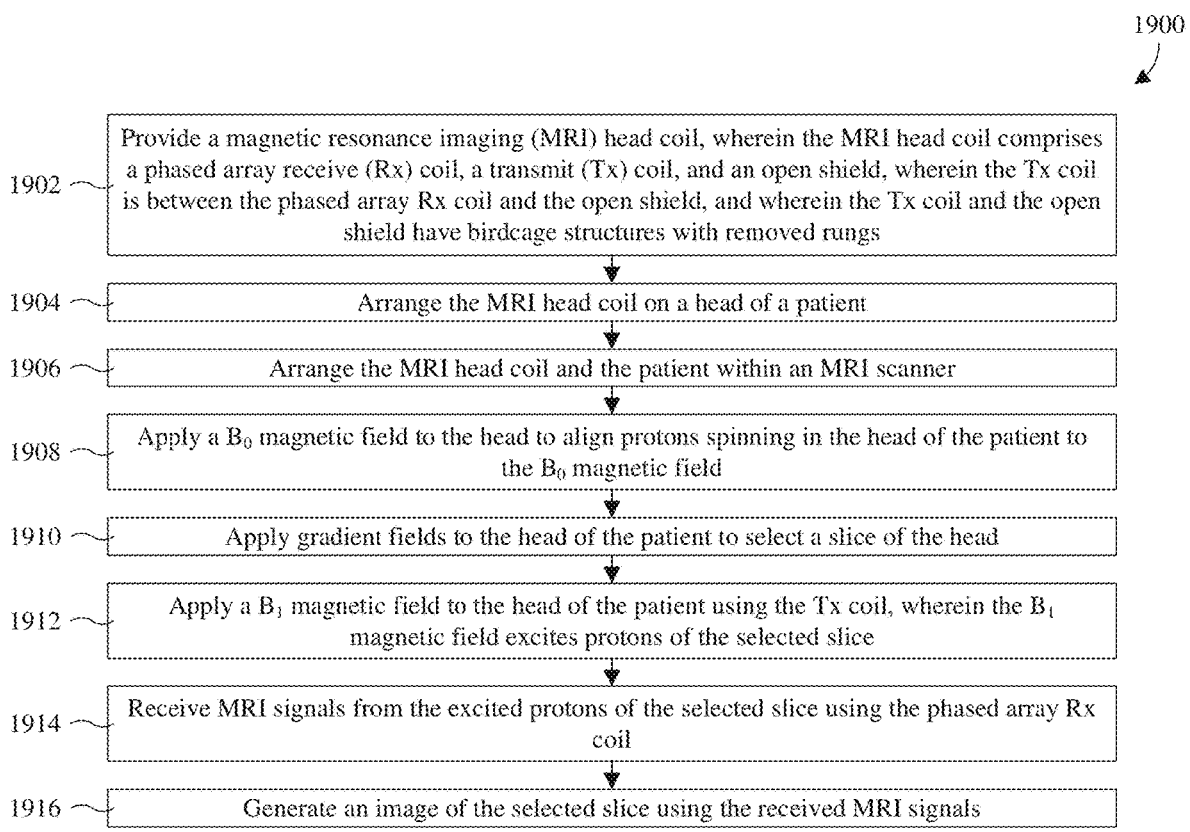

FIG. 19 illustrates a flow chart of some embodiments of a method for MRI using an MRI head coil in which the MRI head coil comprises a transmit coil, an open shield, and a phased array receive coil.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments of the present disclosure are directed towards: 1) an MRI head coil comprising an open shield; 2) an MRI system comprising the MRI head coil; and 3) a method for performing an MRI process using the MRI head coil. In some embodiments of the MRI head coil, a transmit coil surrounds a phased array receive coil and comprises a resonant birdcage structure. The resonant birdcage structure comprises a plurality of transmit rungs spaced in a first closed path, and inter-rung spacing at one or more first locations on the first closed path is greater than inter-rung spacing at a remainder of the first closed path. The open shield surrounds the transmit coil to contain radiation from the transmit coil and comprises a non-resonant birdcage structure. The non-resonant birdcage structure comprises a plurality of shield rungs spaced in a second closed path and elongated in parallel with the transmit rungs. Further, inter-rung spacing at one or more second locations on the second closed path is greater than inter-rung spacing at a remainder of the second closed path, and the second location(s) respectively and radially border the first location(s).

The first and second locations may correspond to eyes of a patient and, in some embodiments, other suitable features of the patient. Because inter-rung spacing at the first and second locations is greater than at remainders of the first and second closed paths, the patient may have a large, unobstructed view through the transmit coil and the open shield to an outside of the MRI head coil when the MRI head coil is positioned on the patient. This may improve patient comfort and/or reduce patient anxiety from claustrophobia.

Because the MRI head coil includes a transmit coil, the MRI head coil may be used with MRI systems that do not have built-in transmit coils (e.g., WBCs). For example, many MRI systems at 7 tesla (T) and above do not have built-in transmit coils, such that the MRI head coil finds application within such MRI systems. Further, it has been appreciated that where a total number of the transmit rungs exceeds 16 and is the same as a total number of the shield rungs, the transmit coil may have high transmit efficiency that counters increased radiation loss from the open configuration of the open shield and/or from high $B_0$ magnetic field strengths. As such, the MRI head coil may produce high quality images. The high $B_0$ magnetic field strengths include $B_0$ magnetic field strengths at or greater than about 7T.

Figure 1A:
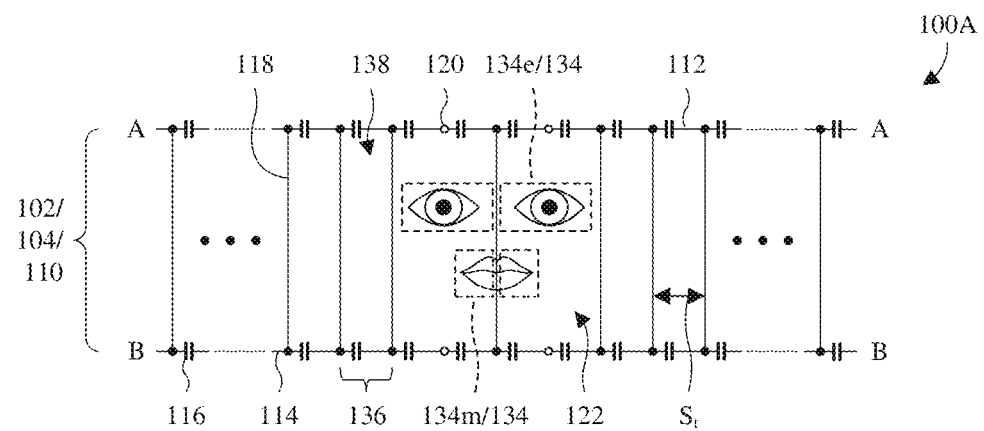
FIGS. 1A-1D illustrate various schematic views of some embodiments of a magnetic resonance imaging (MRI) head coil comprising a transmit coil, an open shield, and a phased array receive coil.
Figure 1B:
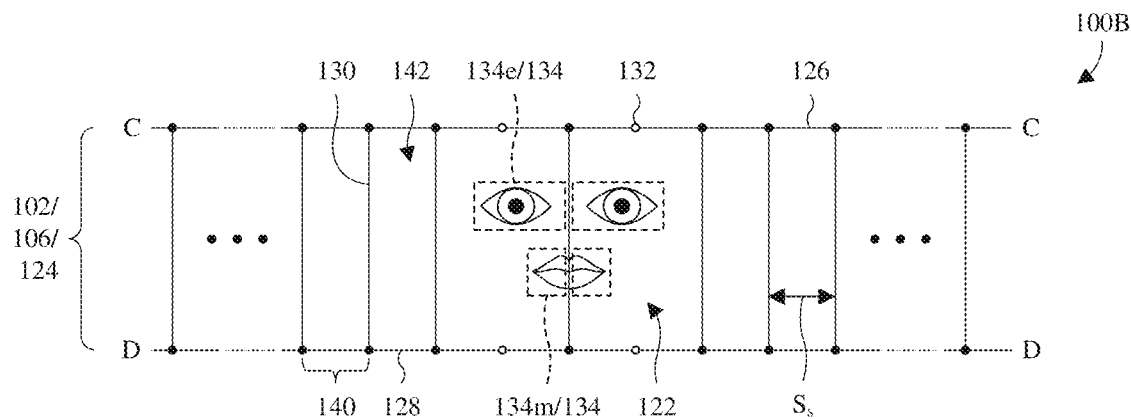
Figure 1C:
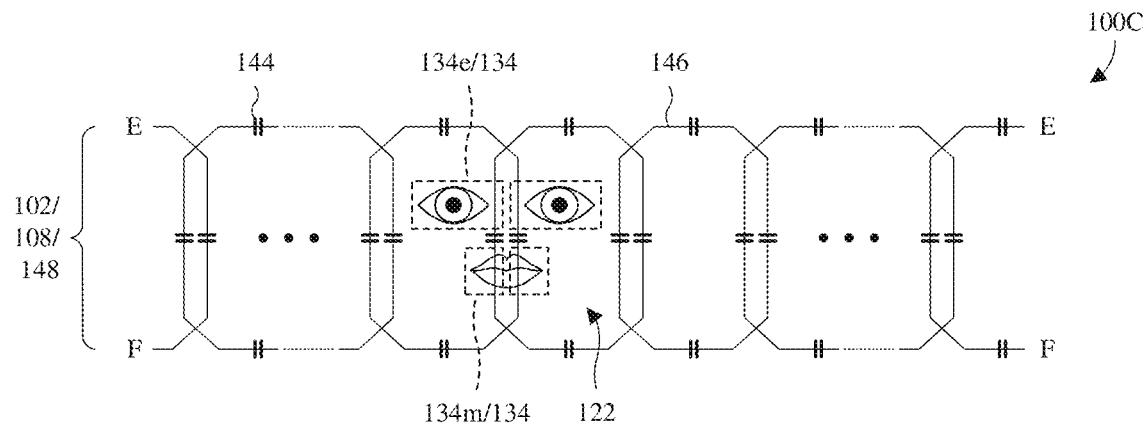
Figure 1D:
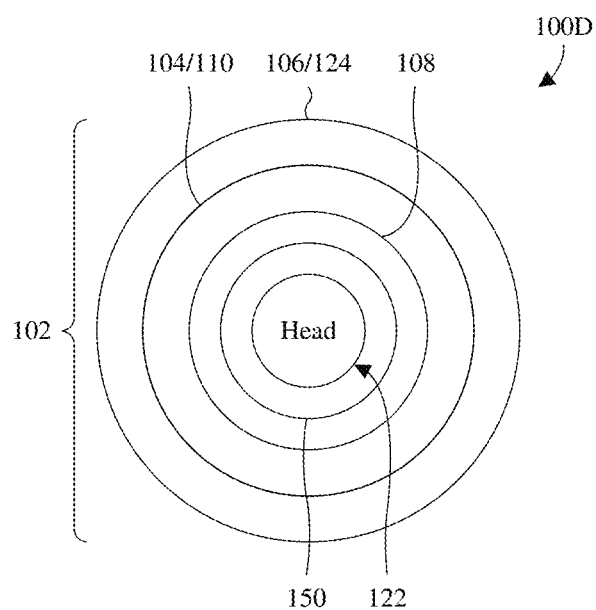

With reference to FIGS. 1A-1D, various schematic views 100A-100D of some embodiments of an MRI head coil 102 comprising a transmit coil 104, an open shield 106, and a phased array receive coil 108 is provided. FIGS. 1A-1C individually provide the transmit coil 104, the open shield 106, and the phased array receive coil 108, whereas FIG. 1D provides the transmit coil 104, the open shield 106, and the phased array receive coil 108 together. Further, the transmit coil 104, the open shield 106, and the phased array receive coil 108 extend in closed paths around a cavity (see FIG. 1D) but are flattened in FIGS. 1A-1C for ease of illustration.

The transmit coil 104 is or otherwise comprises a transmit birdcage structure 110, which may, for example, also be known as a transmit birdcage coil. The transmit birdcage structure 110 is configured to generate a $B_1$ magnetic field during MRI and comprises a top transmit ring 112, a bottom transmit ring 114, a plurality of transmit capacitors 116, and a plurality of transmit rungs 118. The ellipses are each used to represent zero or more additional transmit rungs and zero or more additional transmit capacitors. The transmit capacitors 116 are arranged along the top and bottom transmit rings 112, 114 to separate the transmit rungs 118 from each other and to create resonance. Further, the transmit rungs 118 are elongated in parallel from the top transmit ring 112 to the bottom transmit ring 114. In contrast with a standard birdcage structure, the transmit birdcage structure 110 has several rungs removed at first locations 120, which are denoted by white circles. The first locations 120 are individual to the removed transmit rungs and correspond to eyes of a patient 122 and, in some embodiments, one or more other suitable features of the patient 122. Non-limiting examples of other suitable features of the patient 122 include a mouth, a nose, and ears. The transmit rungs 118 and the first locations 120 are evenly spaced in a closed path, such that inter-rung spacing $S_t$ is greater at the first locations 120 than at a remainder of the transmit birdcage structure 110. In some embodiments, inter-rung spacing $S_t$ at the first locations 120 is an integer multiple of inter-rung spacing $S_t$ at the remainder of the transmit birdcage structure 110.

Because the MRI head coil 102 includes the transmit coil 104, the MRI head coil 102 may be used with MRI systems that do not have built-in transmit coils (e.g., WBCs). For example, many MRI systems at 7T and above do not have built-in transmit coils, such that the MRI head coil 102 finds application within such MRI systems.

The open shield 106 surrounds the transmit coil 104 to contain radiation emitted by the transmit coil 104 and to reduce radiation loss. Further, the open shield 106 is or otherwise comprises a shield birdcage structure 124. The shield birdcage structure 124 has the same structure as the transmit birdcage structure 110, except that the shield birdcage structure 124 has a larger diameter and is devoid of capacitors for resonance (except for direct current (DC) block capacitors to block gradient eddy current). Hence, the shield birdcage structure 124 comprises a top shield ring 126, a bottom shield ring 128, and a plurality of shield rungs 130. As above, the ellipses are each used to represent zero or more additional shield rungs. The shield rungs 130 are elongated in parallel with the transmit rungs 118 from the top shield ring 126 to the bottom shield ring 128, and a total number of the shields rungs 130 is the same as a total number of the transmit rungs 118. Further, the shield birdcage structure 124 has several rungs removed at second locations 132, and a total number of the removed shields rungs is the same as a total number of the removed transmit rungs. The second locations 132 are individual to the removed shield rungs and are denoted by white circles. Further, the second locations 132 respectively and radially neighbor the first locations 120. The shield rungs 130 and the second locations 132 are evenly spaced in a closed path, such that inter-rung spacing $S_s$ is greater at the second locations 132 than at a remainder of the shield birdcage structure 124. In some embodiments, inter-rung spacing $S_s$ at the second locations 132 is an integer multiple of inter-rung spacing $S_s$ at the remainder of the shield birdcage structure 124. Further, a sum of the total number of the shield rungs 130 and the total number of the second locations 132 is the same as a sum of the total number of the transmit rungs 118 and the total number of the first locations 120.

Multiple openings 134 extend through the transmit coil 104 and the open shield 106 at the first and second locations 120, 132. For example, eye openings 134e and mouth openings 134m may extend through the transmit coil 104 and the open shield 106 respectively at the first and second locations 120, 132. The openings 134 provide unobstructed paths to an outside of the MRI head coil 102 to improve patient comfort and/or to reduce patient anxiety from claustrophobia when the MRI head coil 102 is positioned on the patient 122. Because the transmit birdcage structure 110 and the shield birdcage structure 124 have rungs removed respectively at the first and second locations 120, 132, inter-rung spacing $S_t$, $S_s$ is greatest at the first and second locations 120, 132 and hence the openings 134 may be larger than they would otherwise be. If no rungs were removed, the openings 134 would be small and hence any improvement in patient comfort and/or reduction in patient anxiety would be marginal.

Because the open shield 106 is open, instead of closed (e.g., a continuous copper cylinder), the openings 134 may be formed to increase patient comfort and/or reduce patient anxiety from claustrophobia. However, also because the open shield 106 is open, the transmit coil 104 is prone to more radiation loss than it would have. Radiation loss is proportional to the square of the frequency (e.g., the Larmor frequency) of radiofrequency (RF) current flowing through the transmit birdcage structure 110, and the frequency of the RF current is proportional to the $B_0$ magnetic field strength during an MRI process. Therefore, radiation loss increases with $B_0$ magnetic field strength. Further, as radiation loss increases, the quality (Q) factor of the transmit birdcage structure 110 decreases. This degrades image quality and, if the Q factor becomes less than one, the transmit birdcage structure 110 may no longer resonate and may hence be unusable.

It has been appreciated that where a total number of the transmit rungs 118 and a total number of the shield rungs 130 is high, transmit efficiency may be high. The total numbers may, for example, be high when in excess about 16 or some other suitable value. The high transmit efficiency may counter increased radiation loss from the open configuration of the open shield 106 and/or from high $B_0$ magnetic field strengths. As such, the Q factor and the image quality may be high. The high $B_0$ magnetic field strengths may, for example, be $B_0$ magnetic field strengths at or greater than about 7T or some other suitable value.

For the same $B_1$ magnetic field at the center of the transmit birdcage structure 110, the RF current through each of the transmit rungs 118 decreases as a total number of the transmit rungs 118 is increased. For example, if a total number of the transmit rungs 118 increases from 12 to 24, the RF current through each of the transmit rungs 118 may decrease by about 50%. The RF current through each of the transmit rungs 118 for the same $B_1$ magnetic field at the center of the transmit birdcage structure 110 may therefore be written as follows.

$$I_{rung} \sim \frac{B_1}{N} \qquad \text{Eq. (1)}$$

$I_{rung}$ is RF current through each of the transmit rungs 118, $B_1$ is the magnetic field at the center of the transmit birdcage structure 110, and N is the total number of the transmit rungs 118.

Radiation power from each of the transmit rungs 118 is proportional to the square of RF current flowing through the transmit rung. Further, total radiation power of the transmit birdcage structure 110 is proportional to the sum of all rung radiations, which may be written as follows.

$$P_{total\ radiation} \sim I_{rung}^2 \times N \qquad \text{Eq. (2)}$$

$P_{total\ radiation}$ is total radiation power and $I_{rung}$ and N are as in Eq. (1). By combining Eq. (1) and Eq. (2), total radiation power may be simplified as follows:

$$P_{total\ radiation} \sim \frac{B_1^2}{N} \qquad \text{Eq. (3)}$$

Therefore, for the same $B_1$ magnetic field at the center of the transmit birdcage structure 110, total radiation power decreases as the total number of the transmit rungs 118 increases.

Because increasing the total number of the transmit rungs 118 allows the same $B_1$ magnetic field at less total transmit power, transmit efficiency may be increased. Further, because increasing the total number of the transmit rungs 118 reduces total transmit power for the same $B_1$ magnetic field, radiation loss may be reduced. For example, by changing the transmit birdcage structure 110 from 12 transmit rungs to 24 transmit rungs, total transmit power and hence total radiation loss may be reduced by about 50%. Accordingly, the high transmit efficiency may counter increased radiation loss from the open configuration of the open shield 106 and/or from high $B_0$ magnetic field strengths. This, in turn, allows high image quality.

While increasing the total number of the transmit rungs 118 counters radiation loss and improves image quality, it does so at the cost of decreased inter-rung spacing $s_t$, $s_s$. If no rungs are removed at the openings 134, the openings 134 may be too small to provide a meaningful improvement in patient comfort and/or a meaningful reduction in patient anxiety from claustrophobia. For example, suppose the transmit birdcage structure 110 has an interior diameter of about 25 centimeters (cm), which is common of MRI head coils. Further, suppose the transmit birdcage structure 110 has a rung width of zero and does not have any rungs removed. Therefore, if the transmit birdcage structure 110 has 24 total transmit rungs, inter-rung spacing may be about 3.2 cm (e.g., $=(25*\pi)/24$), which may be too small for the openings 134 to have a meaningful size for improvement in patient comfort and/or patient anxiety from claustrophobia.

By removing transmit and shield rungs respectively at the openings 134, the openings 134 may be increased in size in proportion to the number of rungs removed. For example, suppose that the transmit birdcage structure 110 is the same as the immediately preceding example, except that the transmit birdcage structure 110 has a single transmit rung removed at each of the eye openings 134e. Therefore, because the transmit birdcage structure 110 has a single rung removed at each of the eye openings 134e, inter-rung spacing $s_t$, $s_s$ at each of the eye openings 134e is doubled and becomes about 6.4 cm (e.g., $=3.2*2$). This allows the eye openings 134e to have a large size suitable for a meaningful improvement in patient comfort and/or patient anxiety from claustrophobia.

Because removing transmit rungs from the transmit birdcage structure 110 increases asymmetry in the rung configuration, the uniformity of the $B_1$ magnetic field generated by the transmit birdcage structure 110 decreases. The $B_1$ magnetic field uniformity may be estimated using the Biot-Savart Law calculation and may therefore be written as follows.

$$\text{uniformity} = 1 - \frac{B_{1\_max} - B_{1\_min}}{B_{1\_max} + B_{1\_min}} \quad \text{Eq. (4)}$$

uniformity is the uniformity of the $B_1$ magnetic field, $B_{1\_max}$ is the maximum value of the $B_1$ magnetic field, and $B_{1\_min}$ is the minimum value of the $B_1$ magnetic field.

Figure 2A:
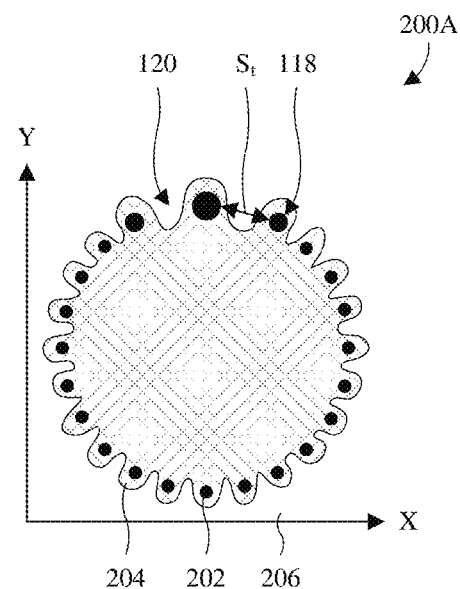
FIGS. 2A-2C illustrate cross-sectional $B_1$ magnetic field maps for various different embodiments of the transmit coil of FIGS. 1A-1D.
Figure 2B:
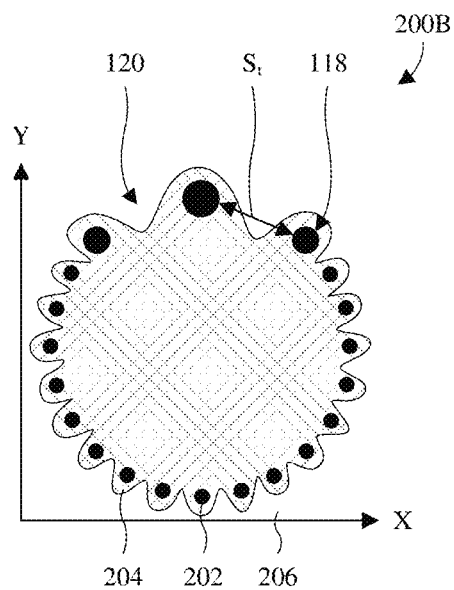
Figure 2C:
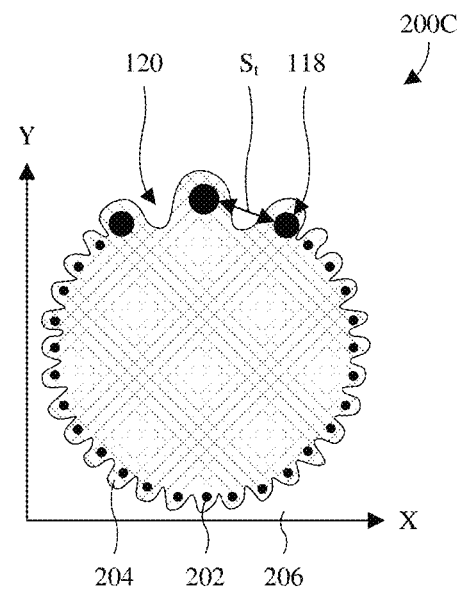

With reference to FIGS. 2A-2C, cross-sectional $B_1$ magnetic field maps 200A-200C for various different embodiments of the transmit coil 104 are provided. Black regions 202, crosshatched regions 204, and white regions 206 in FIGS. 2A-2C have magnetic field strengths that are respectively and comparatively high, medium, and low. For example, the black regions 202 have the highest magnetic field strengths compared to the crosshatched regions 204 and the white regions 206. Further, the black regions correspond to the transmit rungs 118.

In FIG. 2A, the transmit birdcage structure 110 is a 22-rung birdcage structure in which two transmit rungs have been removed respectively at the first locations 120. Hence, the transmit birdcage structure 110 would be a 24-rung birdcage structure if no transmit rungs were removed. In FIG. 2B, the transmit birdcage structure 110 is a 20-rung birdcage structure in which four transmit rungs have been removed respectively at the first locations 120. Hence, the transmit birdcage structure 110 would be a 24-rung birdcage structure if no transmit rungs were removed. In FIG. 2C, the transmit birdcage structure 110 is a 28-rung birdcage structure in which in which four transmit rungs have been removed respectively at the first locations 120. Hence, the transmit birdcage structure 110 would be a 32-rung birdcage structure if no transmit rungs were removed. Further, for the discussion hereafter, the transmit birdcage structure 110 is assumed to have the same diameter in FIGS. 2A-2C. For example, the transmit birdcage structure 110 may have a diameter of about 28 cm or some other suitable diameter in FIGS. 2A-2C.

As seen through comparison of FIG. 2A to FIG. 2B, $B_1$ magnetic field uniformity is less at FIG. 2B than at FIG. 2A because FIG. 2B has more transmit rungs removed. For example, FIG. 2B may have 90% uniformity, whereas FIG. 2A may have 97% uniformity. Other suitable percentages are, however, amenable. Further, as seen through comparison of FIG. 2A to FIG. 2B, inter-rung spacing $S_t$ at the first locations 120 is larger in FIG. 2B than in FIG. 2A because FIG. 2B has more transmit rungs removed. For example, supposing the transmit birdcage structure 110 has a diameter of about 28 cm in both FIGS. 2A and 2B, inter-rung spacing $S_t$ at the first locations 120 may be about 7.2 cm and about 10.8 cm respectively in FIGS. 2A and 2B and inter-rung spacing $S_t$ at a remainder of the transmit coil 104 may be about 3.6 cm in FIGS. 2A and 2B.

As seen through comparison of FIG. 2C to FIG. 2B, $B_1$ magnetic field uniformity is greater at FIG. 2C than at FIG. 2B because FIG. 2C has more transmit rungs. For example, FIG. 2C may have 96% uniformity, whereas FIG. 2B may have 90% uniformity. Other suitable percentages are, however, amenable. Further, as seen through comparison of FIG. 2C to FIG. 2B, inter-rung spacing $S_t$ at the first locations 120 is smaller in FIG. 2C than in FIG. 2B because FIG. 2C has more transmit rungs. For example, supposing the transmit birdcage structure 110 has a diameter of about 28 cm in both FIGS. 2B and 2C, inter-rung spacing $S_t$ at the first locations 120 may be about 10.8 and about 8.24 cm respectively in FIGS. 2B and 2C and inter-rung spacing $S_t$ at a remainder of the transmit birdcage structure 110 may about 3.6 cm and 2.7 cm respectively in FIGS. 2B and 2C.

Referring back to FIGS. 1A-1D, the transmit birdcage structure 110 further comprises a plurality of transmit grid segments 136 bordering and/or overlapping in a closed path. The transmit grid segments 136 are individual to and respectively surround transmit windows 138 separating the transmit rungs 118 from each other and further separating the top transmit ring 112 from the bottom transmit ring 114. Further, the transmit grid segments 136 are individual to pairs of neighboring transmit rungs and each of the transmit grid segments 136 is between the transmit rungs of the individual pair of neighboring transmit rungs. That transmit grid segments 136 may, for example, each have a ring-shaped structure or some other suitable structure.

Similar to the transmit coil 104, the shield birdcage structure 124 further comprises a plurality of shield grid segments 140 bordering and/or overlapping in a closed path. The shield grid segments 140 are individual to and respectively surround shield windows 142 separating the shield rungs 130 from each other and further separating the top shield ring 126 from the bottom shield ring 128. Further, the shield grid segments 140 are individual to pairs of neighboring shield rungs and each of the shield grid segments 140 is between the shield rungs of the individual pair of neighboring shield rungs. That shield grid segments 140 may, for example, each have a ring-shaped structure or some other suitable structure.

Because transmit rungs are removed at the first locations 120, the transmit grid segments 136 at the first locations 120 and the transmit windows 138 at the first locations 120 are larger than at a remainder of the transmit birdcage structure 110. Similarly, because shield rungs are removed at the second locations 132, the transmit grid segments 136 at the second locations 132 and the shield windows 142 at the second locations 132 are larger than at a remainder of the shield birdcage structure 124. The large window and grid sizes, in turn, allow the openings 134 to be large, which may improve patient comfort and/or reduce patient anxiety from claustrophobia.

The phased array receive coil 108 is surrounded by the transmit coil 104 and comprises a plurality of capacitors 144 and a plurality of loops 146. The ellipses are each used to represent zero or more additional loops. The capacitors 144 are arranged along the loops 146 to facilitate tuning and matching. The loops 146 are in a single row 148 and each of the loops 146 overlaps with each neighboring loop to reduce mutual inductance with the neighboring loop. Further, the loops 146 have the same size and/or shape and are oriented around the openings 134 so the openings 134 are completely or substantially unobstructed by the phased array receive coil 108. The loops 146 may, for example, be formed from coaxial cable, conductive traces on a printed circuit board (PCB), or by some other suitable conductive structure. In alternative embodiments, the loops 146 are in multiple rows and/or are non-overlapping. Further, in alternative embodiments, at least some of the loops 146 has/have a different size and/or shape than a remainder of the loops 146.

A former 150 is surrounded by the phased array receive coil 108. The former 150 is transparent to RF radiation and is a rigid or semi-rigid structure that provides mechanical support to the transmit coil 104, the open shield 106, and the phased array receive coil 108. Further, the former 150 has a shape to which the transmit coil 104, the open shield 106, and the phased array receive coil 108 are conformed. For example, the former 150 may have a cylindrical shape, a dome shape, or some other suitable shape. The former 150 may, for example, be formed of a polymer or some other suitable material. As with the transmit coil 104, the open shield 106, and the phased array receive coil 108, the openings 134 extending through the former 150 to improve patient comfort and/or reduce patient anxiety from claustrophobia.

While FIGS. 1A-1D are described together, each of FIGS. 1A-1D may stand alone from one, some, or all of the remaining figures in alternative embodiments. While FIGS. 1A-1D illustrate the MRI head coil 102 with multiple openings 134, there may be more or less openings in alternative embodiments. For example, there may be only one opening 134 in alternative embodiments. While FIGS. 1A-1D illustrate the transmit birdcage structure 110 and the shield birdcage structure 124 each with two removed rungs, more or less rungs may be removed in alternative embodiments. While the MRI head coil 102 is focused towards MRI on the head of the patient 122, the MRI head coil 102 may be used for MRI on other anatomical features of the patient 122 and/or other suitable scan objects.

Figure 3A:
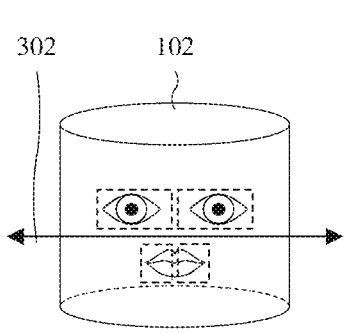
FIGS. 3A-3C illustrate perspective views of some different embodiments of the MRI head coil of FIGS. 1A-1D.
Figure 3B:
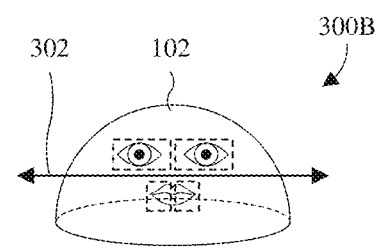
Figure 3C:
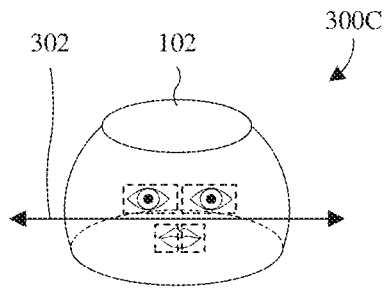

With reference to FIGS. 3A-3C, perspective views 300A-300C of some different embodiments of the MRI head coil 102 of FIGS. 1A-1D is provided in which shapes of the MRI head coil 102 are varied. The schematic view 100D of FIG. 1D may, for example, be taken along line 302 in any of FIGS. 3A-3C and/or the schematic views 100A-100C of FIGS. 1A-1C may, for example, conform to any of the shapes in FIGS. 3A-3C.

In FIG. 3A, the MRI head coil 102 has a cylindrical shape. In FIG. 3B, the MRI head coil 102 has a dome shape. In FIG. 3C, the MRI head coil 102 has a partial sphere in which top and bottom portions have been removed. In alternative embodiments, the MRI head coil 102 has some other suitable shape. In each of FIGS. 3A-3C, the shape of the MRI head coil 102 may be determined by the former 150 (see FIG. 1D). Further, in each of FIGS. 3A-3C, the transmit rungs 118 of FIG. 1A and the shield rungs 130 of FIG. 1B may be elongated vertically from a top of the MRI head coil 102 to a bottom of the MRI head coil 102.

With reference to FIGS. 4A-4D, various schematic views 400A-400D of some embodiments of the MRI head coil 102 of FIGS. 1A-1D are provided in which the transmit birdcage structure 110 and the shield birdcage structure 124 have 17 rungs and in which the phased array receive coil 108 has 6 loops 146. The schematic views 400A-400D of FIGS. 4A-4D correspond to the schematic views 100A-100D of FIGS. 1A-1D.

The transmit birdcage structure 110 has 17 transmit rungs 118 and two transmit rungs removed respectively at the first locations 120. Further, the transmit rungs 118 and the first locations 120 are evenly spaced in a first closed path. Similarly, the shield birdcage structure 124 has 17 shield rungs 130 and two shield rungs removed respectively at the second locations 132. Further, the shield rungs 130 and the removed shield removes are evenly spaced in a second closed path. Accordingly, the transmit birdcage structure 110 and the shield birdcage structure 124 have the same total number of rungs and the same total number of removed rungs. The transmit rungs 118 are radially aligned respectively with the shield rungs 130, and the first locations 120 of the removed transmit rungs are radially aligned respectively with the second locations 132 of the removed shield rungs. For example, each of the transmit rungs 118 neighbors a corresponding one of the shield rungs 130 along a radial axis $R_1$ in FIG. 4D. As another example, each of the first locations 120 neighbors a corresponding one of the second locations 132 along a radial axis $R_2$ in FIG. 4D.

As described above, inclusion of the transmit coil 104 within the MRI head coil 102 allows use of the MRI head coil 102 with MRI systems without built-in transmit coils. For example, many MRI systems at 7T and above do not have built-in transmit coils, such that the MRI head coil 102 finds application within such MRI systems. Further, having a large number of rungs at the transmit birdcage structure 110 and the shield birdcage structure 124 improves transmit efficiency, which counters radiation loss from the open configuration of the open shield 106 and/or from high $B_0$ magnetic field strength. Further yet, removing rungs from the transmit birdcage structure 110 and the shield birdcage structure 124 allows the openings 134 to be large even when the transmit birdcage structure 110 and the shield birdcage structure 124 have a large number of rungs. This may, in turn, improve patient comfort and/or reduce patient anxiety from claustrophobia.

The phased array receive coil 108 has 6 loops 146 arranged in a single row 148 and each of the loops 146 overlaps with a neighboring one of the loops 146 to reduce mutual inductance. Note that overlaps between the loops 146 are denoted by crosses in FIG. 4D. Further, the loops 146 are arranged around the openings 134, such that the loops 146 are wholly or partially outside the openings 134 and do not interfere with patient comfort. In alternative embodiments, the loops 146 are non-overlapping and/or the single row 148 includes more or less loops 146. Further, in alternative embodiments, the loops 146 are arranged in multiple rows. Note that the loops 146 may include corresponding circuits (not shown). The circuits may, for example, be or include decoupling circuits, preamplifiers, and/or other suitable circuitry.

While FIGS. 4A-4D are described together, each of FIGS. 4A-4D may stand alone from one, some, or all of the remaining figures in alternative embodiments. While FIGS. 4A-4D illustrate the MRI head coil 102 with multiple openings 134, there may be more or less openings in alternative embodiments. For example, there may be only one opening 134 in alternative embodiments. While FIGS. 4A-4D illustrate the transmit birdcage structure 110 and the shield birdcage structure 124 each with two removed rungs, more or less rungs may be removed in alternative embodiments. While the FIGS. 4A-4D illustrate the transmit birdcage structure 110 and the shield birdcage structure 124 each with 17 rungs, more or less rungs are amenable in alternative embodiments.

Figure 4A:
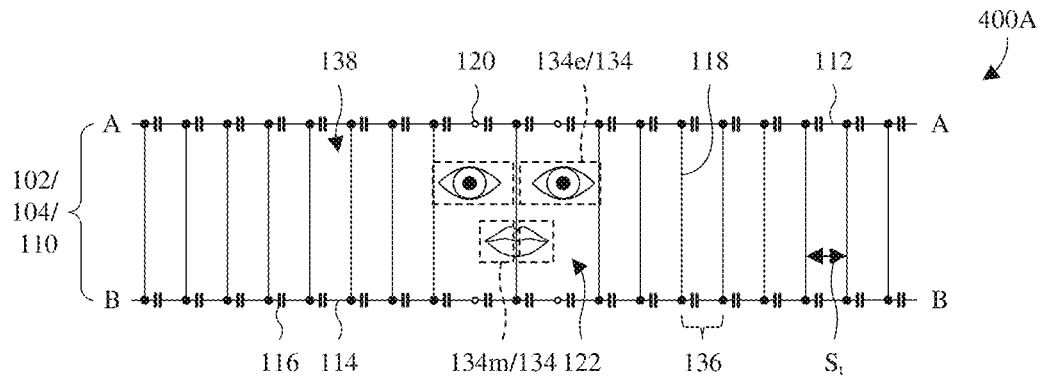
FIGS. 4A-4D illustrate various schematic views of some embodiments of the MRI head coil of FIGS. 1A-1D in which the transmit coil and the open shield have 17-rung birdcage structures and the phased array receive coil has a single 6-loop row.
Figure 4B:
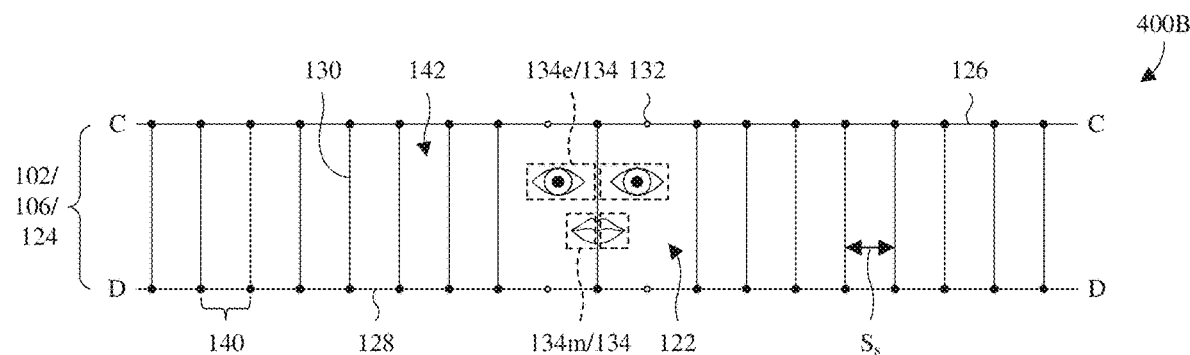
Figure 4C:
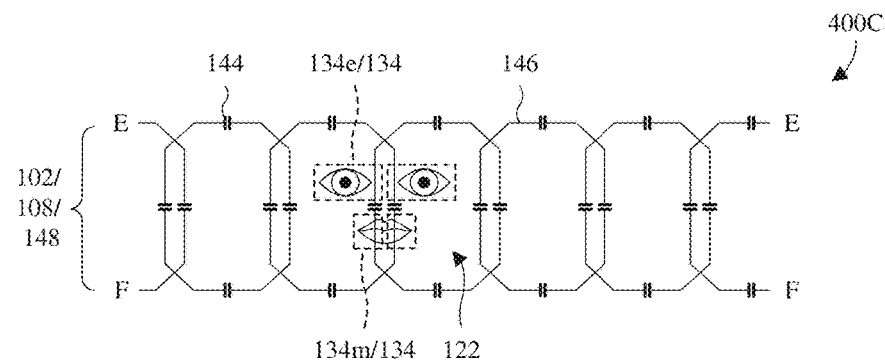
Figure 4D:
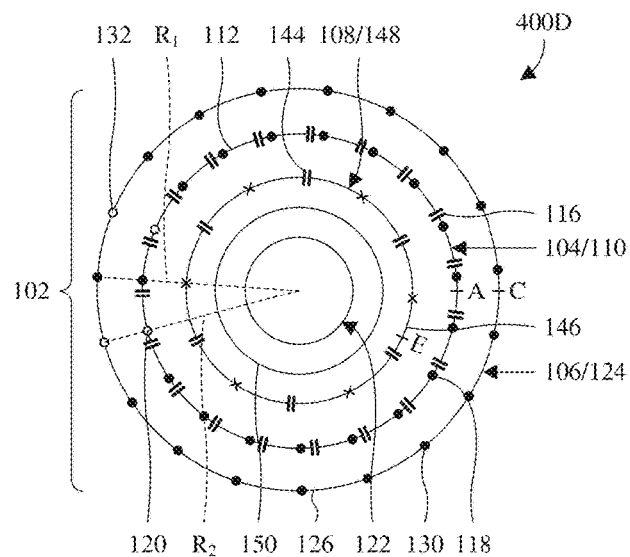
Figure 5A:
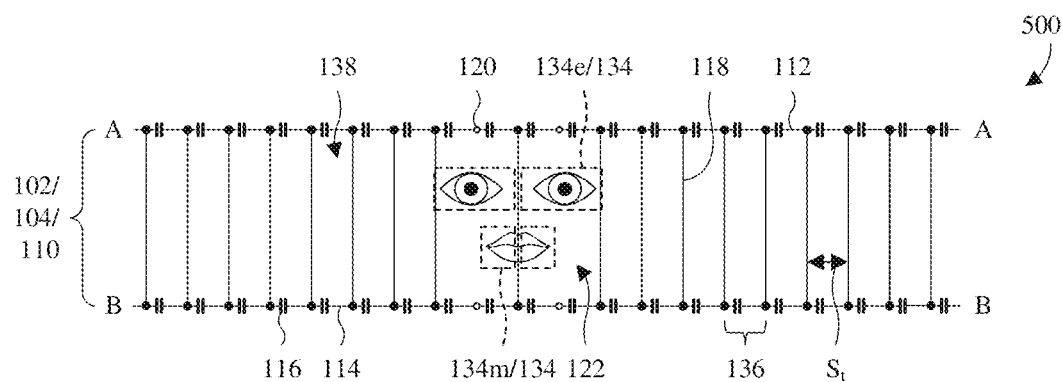
FIGS. 5A-5E illustrate schematic views of some different alternative embodiments of the transmit coil of FIGS. 4A-4D.
Figure 5B:
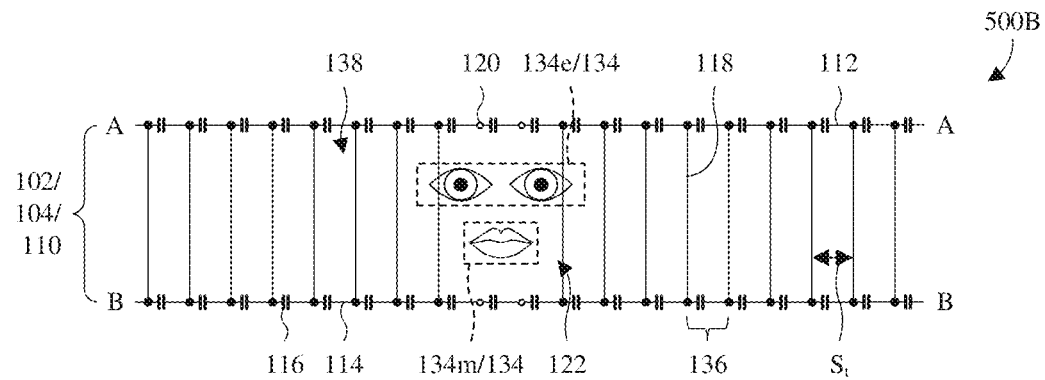
Figure 5C:
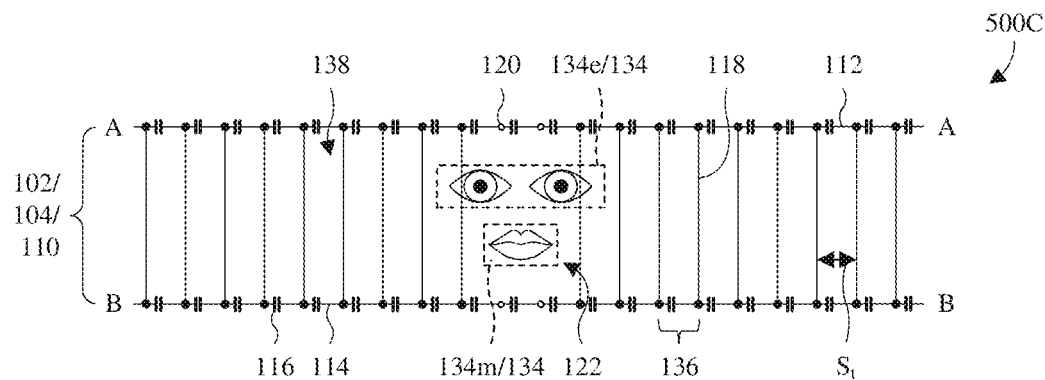
Figure 5D:
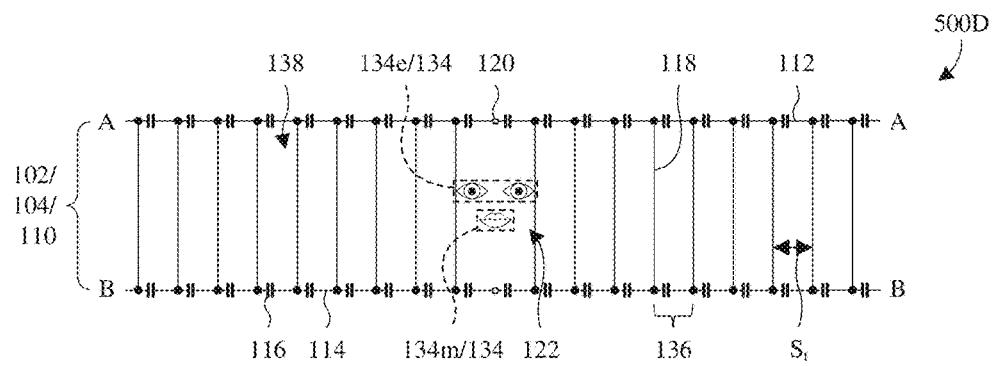
Figure 5E:
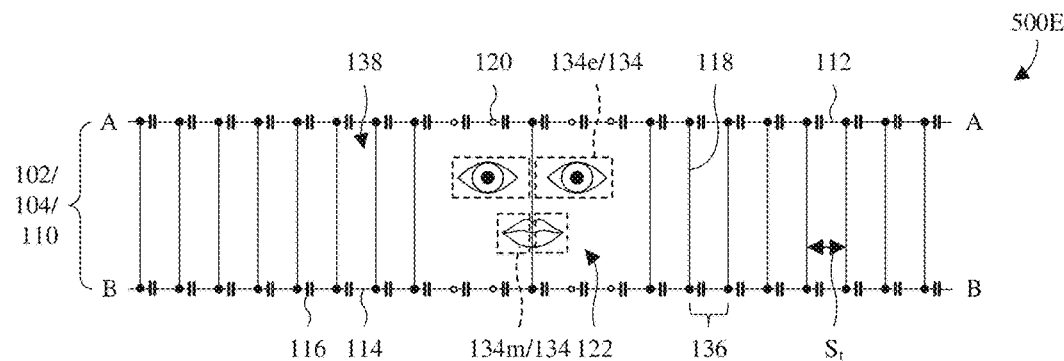

With reference to FIGS. 5A-5E, schematic views 500A-500E of some different alternative embodiments of the transmit coil 104 of FIGS. 4A-4D is provided. In FIG. 5A, the transmit birdcage structure 110 has an additional transmit rung and hence one more rung than the shield birdcage structure 124. In FIGS. 5B and 5C, the locations 120 of the removed transmit rungs directly border instead of being separated by a transmit rung. In FIGS. 5C and 5D, the transmit birdcage structure 110 has an additional transmit rung and hence one more rung than the shield birdcage structure 124. In FIG. 5D, the transmit birdcage structure 110 has a single transmit rung removed. Depending upon the size of the MRI head coil 102 and the total number of the transmit rungs 118, the openings 134 may be small since the openings 134 are all at the location 120 of the single removed transmit rung. As such, the openings 134 may be unsuitable for meaningfully improving patient comfort when the patient 122 is an adult and is hence large. However, even though the openings 134 may be small, the openings 134 may still be larger than without a transmit rung removed and may be suitable for meaningfully improving patient comfort when the patient 122 is a child and is hence small. In FIG. 5E, the transmit birdcage structure 110 has an additional transmit rung removed at each of the eye openings 134e to allow the eye openings 134e to be larger for increased patient comfort.

A sum of the total number of the transmit rungs 118 and the total number of removed transmit rungs in FIGS. 5A, 5C, and 5D is different than a sum of the total number of the shield rungs 130 and the total number of removed shield rungs in FIG. 4B. The difference between the two sums may degrade the effectiveness of the shield birdcage structure 124 at reducing radiation loss from the transmit birdcage structure 110. However, so long as the difference is small (e.g., less than 1 or 2 or some other suitable number), the degradation may be minimal and/or compensated for with higher transmit efficiency from more transmit rungs 118.

Figure 6A:
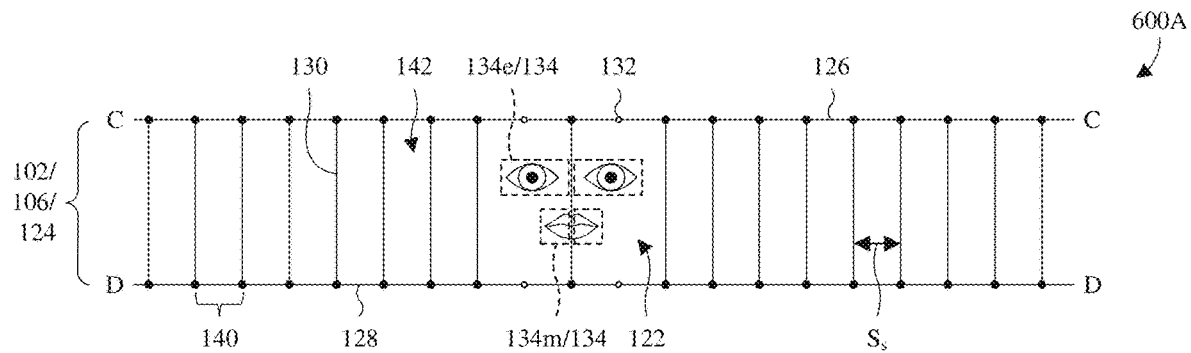
FIGS. 6A-6E illustrate schematic views of some different alternative embodiments of the open shield of FIGS. 4A-4D.
Figure 6B:
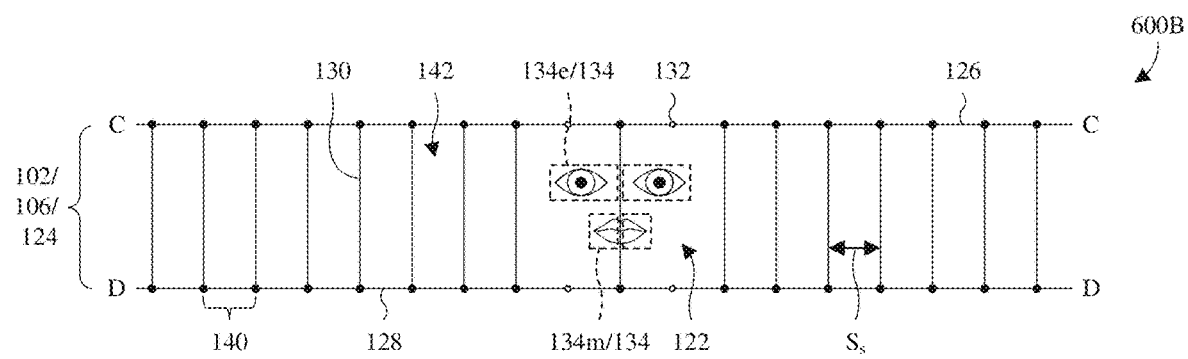
Figure 6C:
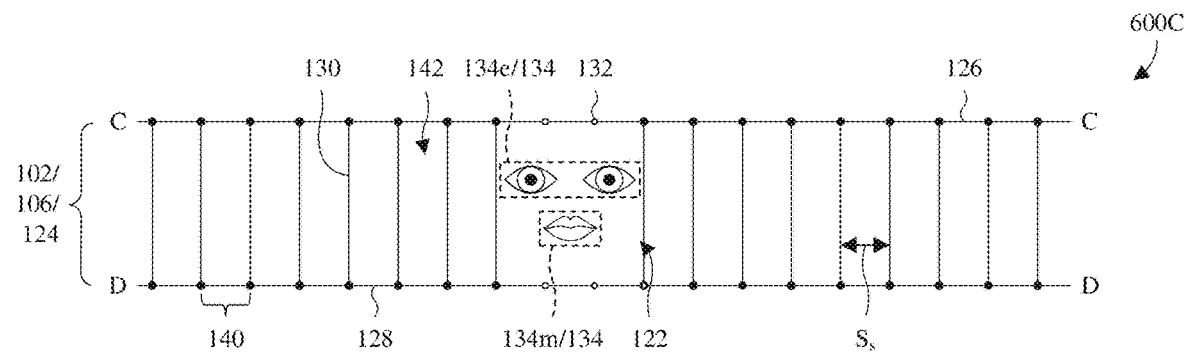
Figure 6D:
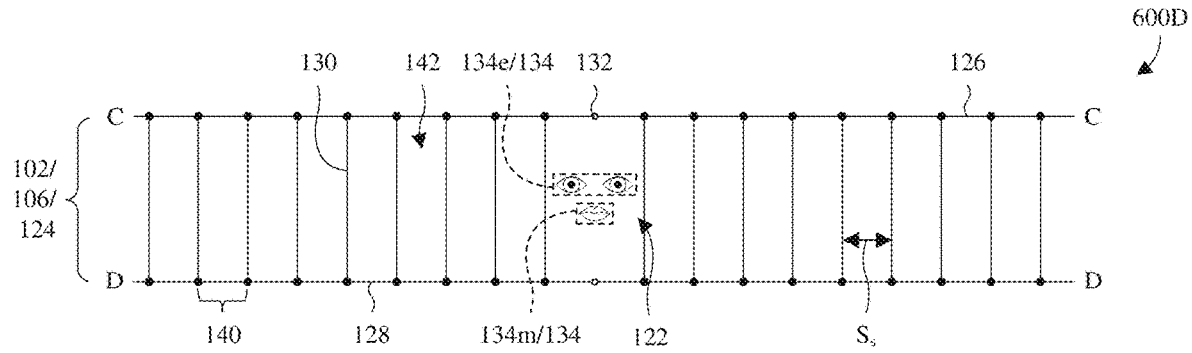
Figure 6E:
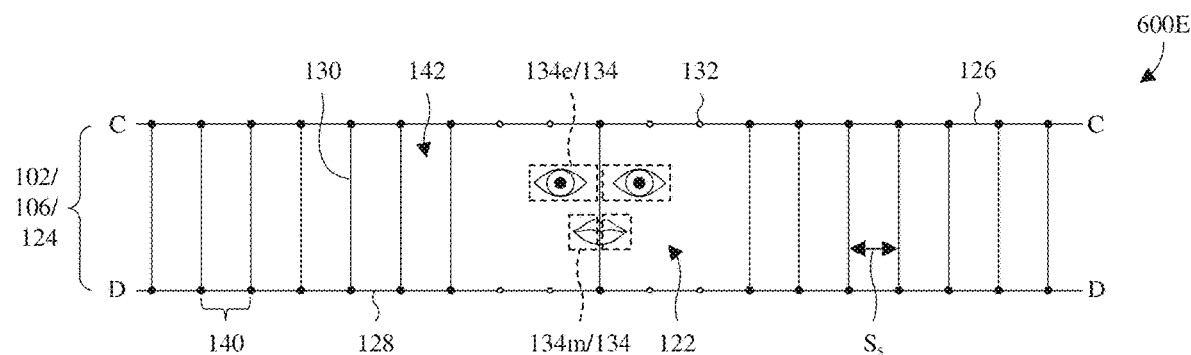

With reference to FIGS. 6A-6E, schematic views 600A-600E of some different alternative embodiments of the open shield 106 of FIGS. 4A-4D is provided. In FIGS. 6A and 6B, the shield birdcage structure 124 has a total number of shield rungs 130 respectively greater than and less than a total number of the transmit rungs 118. In FIG. 6C, the locations 132 of the removed shield rungs directly border instead of being separated by a shield rung. In alternative embodiments, the shield birdcage structure 124 of FIG. 6C has an additional shield rung and hence one more rung than the transmit birdcage structure 110. In FIG. 6D, the shield birdcage structure 124 has a single transmit rung removed. In FIG. 6E, the shield birdcage structure 124 has multiple transmit rungs removed at each of the eye openings 134e.

Figure 7:
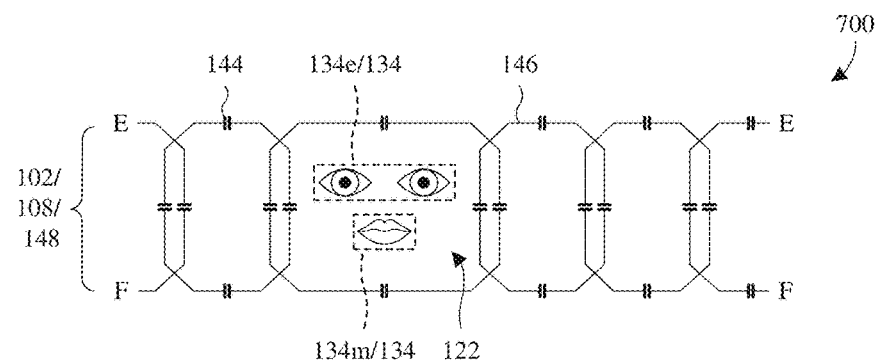
FIG. 7 illustrates a schematic view of some alternative embodiments of the phased array receive coil of FIGS. 4A-4D.

With reference to FIG. 7, a schematic view 700 of some alternative embodiments of the phased array receive coil 108 of FIGS. 4A-4D is provided in which the loop 146 at the openings 134 is larger than a remainder of the loops 146. Further, the remainder of the loops 146 have the same size and/or shape.

Figure 8:
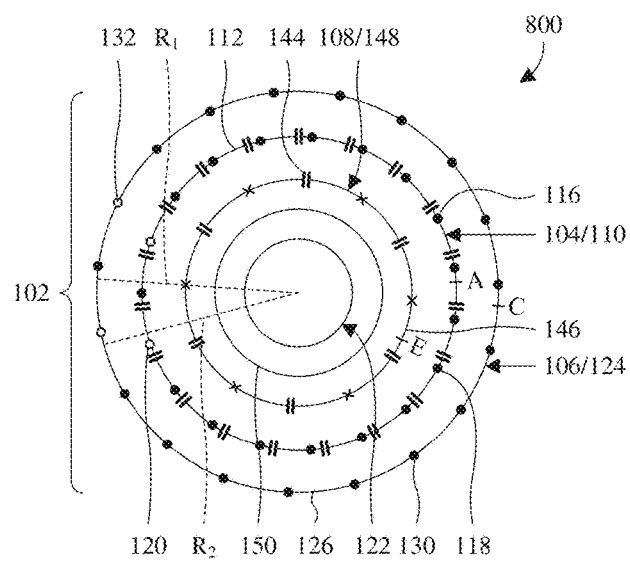
FIG. 8 illustrates a schematic view of some alternative embodiments of the MRI head coil of FIGS. 4A-4D in which shield rungs of the open shield have different polar angles than polar angles respectively of neighboring transmit rungs of the transmit coil.

With reference to FIG. 8, a schematic view 800 of some alternative embodiments of the MRI head coil 102 of FIGS. 4A-4D is provided in which the shield rungs 130 have different polar angles respectively than the polar angles of neighboring transmit rungs 118. As a result, each of the transmit rungs 118 no longer neighbors a corresponding one of the shield rungs 130 along a radial axis $R_1$ and each of the first locations 120 no longer neighbors a corresponding one of the second locations 132 along a radial axis $R_2$.

While FIGS. 5A-5E, 6A-6E, 7, and 8 describe alternative embodiments of constituents in the MRI head coil 102 of FIGS. 4A-4D, it to be appreciated that these alternative embodiments may be mixed in any combination in alternative embodiments of the MRI head coil 102 of FIGS. 4A-4D. For example, the transmit coil 104 and the open shield 106 in alternative embodiments of the MRI head coil 102 of FIGS. 4A-4D may respectively be as in FIGS. 5A and 6C. As another example, the transmit coil 104 and the open shield 106 in alternative embodiments of the MRI head coil 102 of FIGS. 4A-4D may respectively be as in FIGS. 5C and 6E. Further, while FIGS. 5A, 5B, 5D, and 5E and FIGS. 6A, 6C, 6D, and 6E respectively describe alternative embodiments of the transmit coil 104 and the open shield 106 separate from each other, FIGS. 5A, 5B, 5D, and 5E may be paired respectively with FIGS. 6A, 6C, 6D, and 6E in alternative embodiments of the MRI head coil 102 of FIGS. 4A-4D. For example, FIGS. 5A and 6A may be paired, FIGS. 5B and 6C may be paired, FIGS. 5D and 6D may be paired, and FIGS. 5E and 6E may be paired.

Figure 9A:
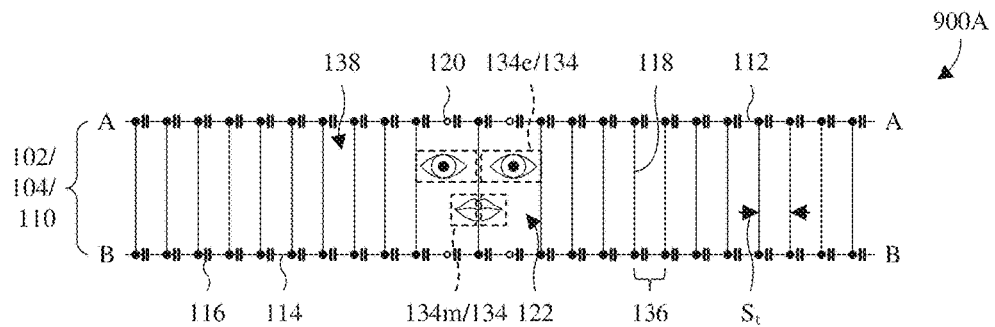
FIGS. 9A and 9B illustrate various schematic views of some alternative embodiments of the MRI head coil of FIGS. 4A-4D in which the transmit coil and the open shield have 22-rung birdcage structures.
Figure 9B:
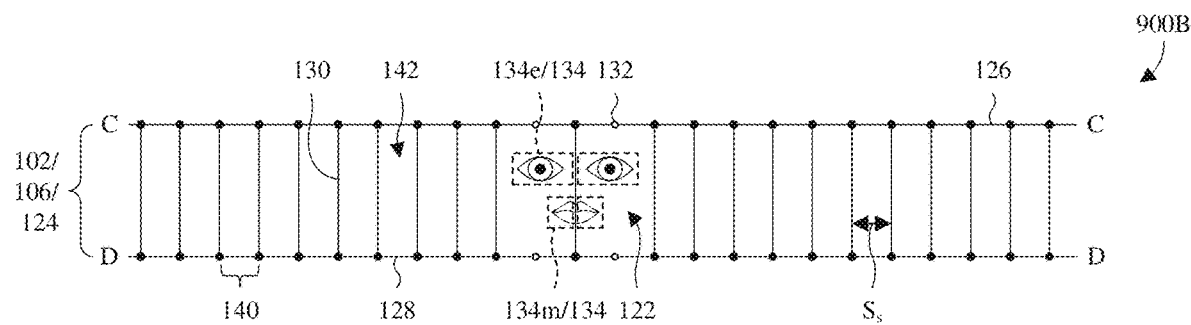

With reference to FIGS. 9A and 9B, various schematic views 900A, 900B of some alternative embodiments of the MRI head coil 102 of FIGS. 4A-4D is provided in which the transmit birdcage structure 110 and the shield birdcage structure 124 have 22 rungs. Hence, the transmit birdcage structure 110 and the shield birdcage structure 124 have more rungs compared to their counterparts in FIGS. 4A-4D. In some embodiments, the transmit birdcage structure 110 has the cross-sectional $B_1$ magnetic field map 200A of FIG. 2A.

Figure 10A:
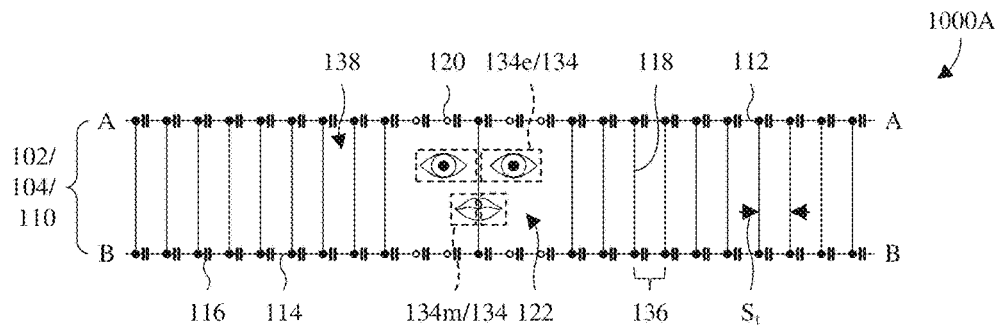
FIGS. 10A and 10B illustrate various schematic views of some alternative embodiments of the MRI head coil of FIGS. 4A-4D in which the transmit coil and the open shield have 20-rung birdcage structures.
Figure 10B:
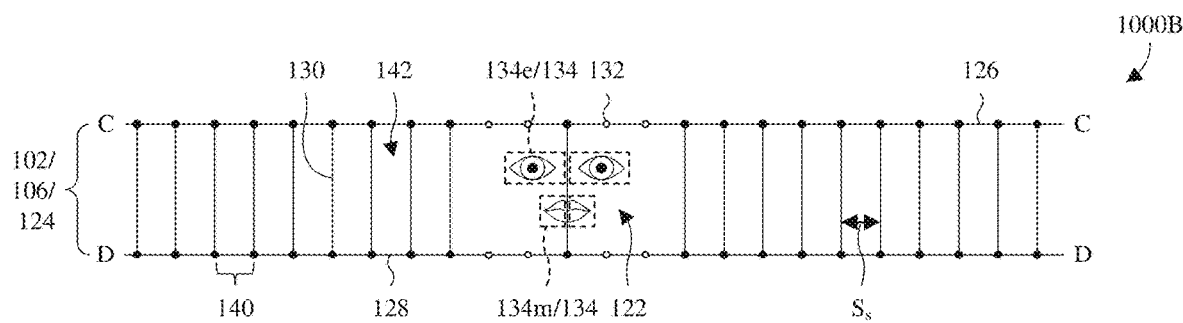

With reference to FIGS. 10A and 10B, various schematic views 1000A, 1000B of some alternative embodiments of the MRI head coil 102 of FIGS. 4A-4D is provided in which the transmit birdcage structure 110 and the shield birdcage structure 124 have 20 rungs and in which the transmit birdcage structure 110 and the shield birdcage structure 124 have two rungs removed at each of the eye opening 134e. Hence, the transmit birdcage structure 110 and the shield birdcage structure 124 have more rungs, and further have more rungs removed, compared to their counterparts in FIGS. 4A-4D. In some embodiments, the transmit birdcage structure 110 has the cross-sectional $B_1$ magnetic field map 200B of FIG. 2B.

Figure 11A:
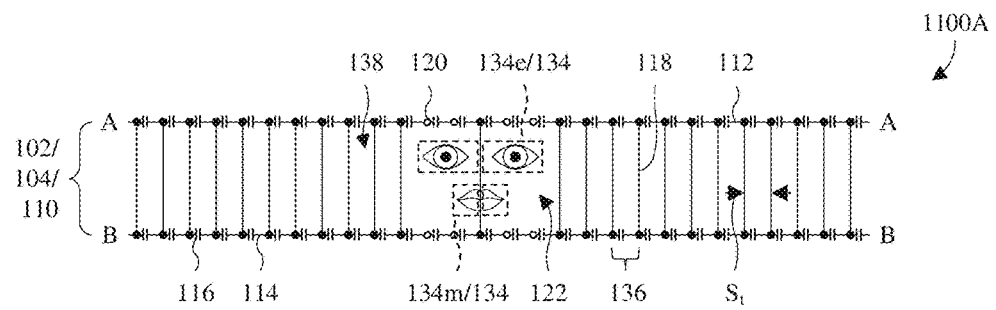
FIGS. 11A and 11B illustrate various schematic views of some alternative embodiments of the MRI head coil of FIGS. 4A-4D in which the transmit coil and the open shield have 28-rung birdcage structures.
Figure 11B:
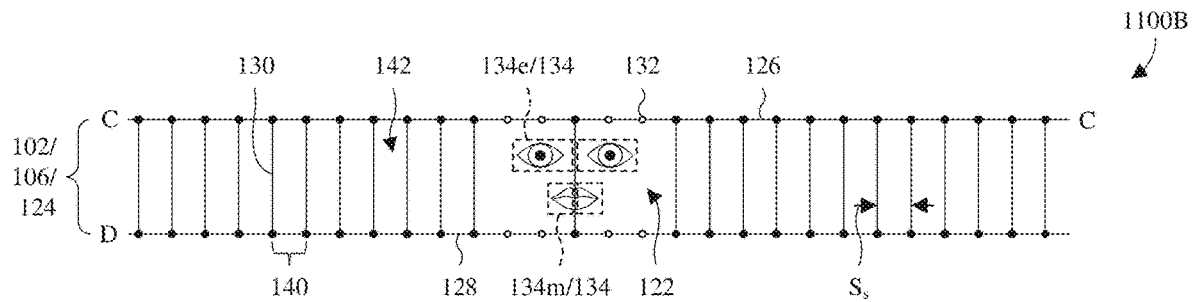
Figure 12A:
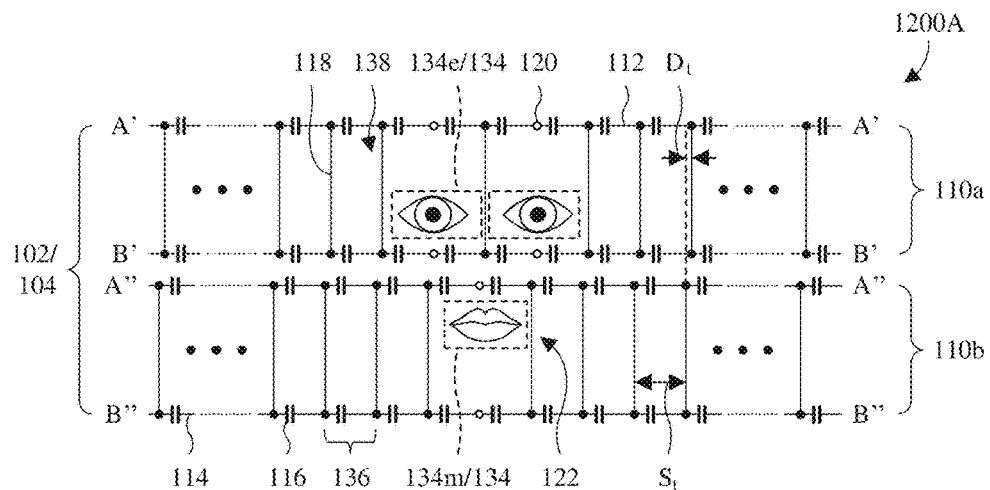
FIGS. 12A-12D illustrate various schematic views of some alternative embodiments of the MRI head coil of FIGS. 1A-1D in which the transmit coil and the open shield have pairs of birdcage structures and in which the phased array receive coil has a pair of rows.
Figure 12B:
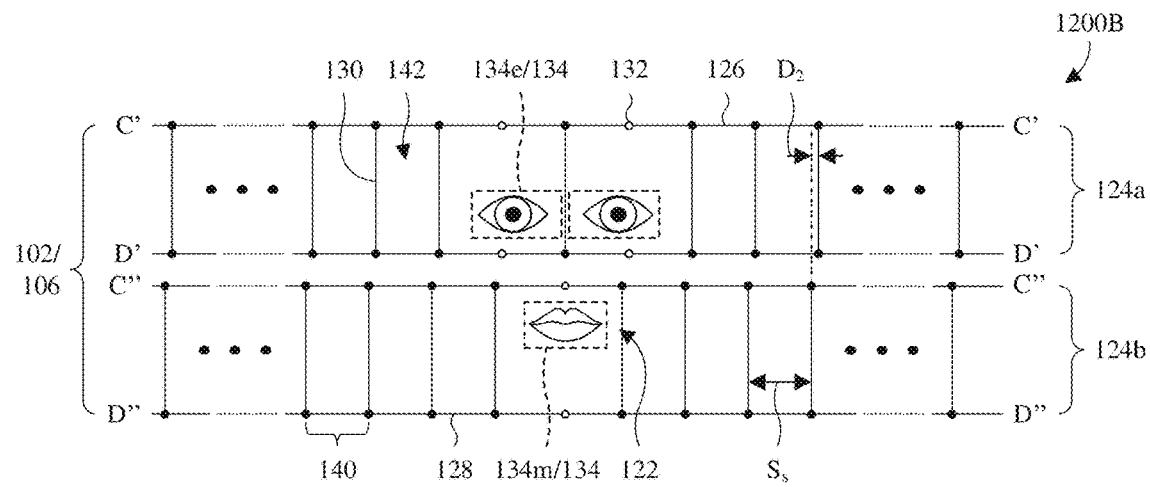
Figure 12C:
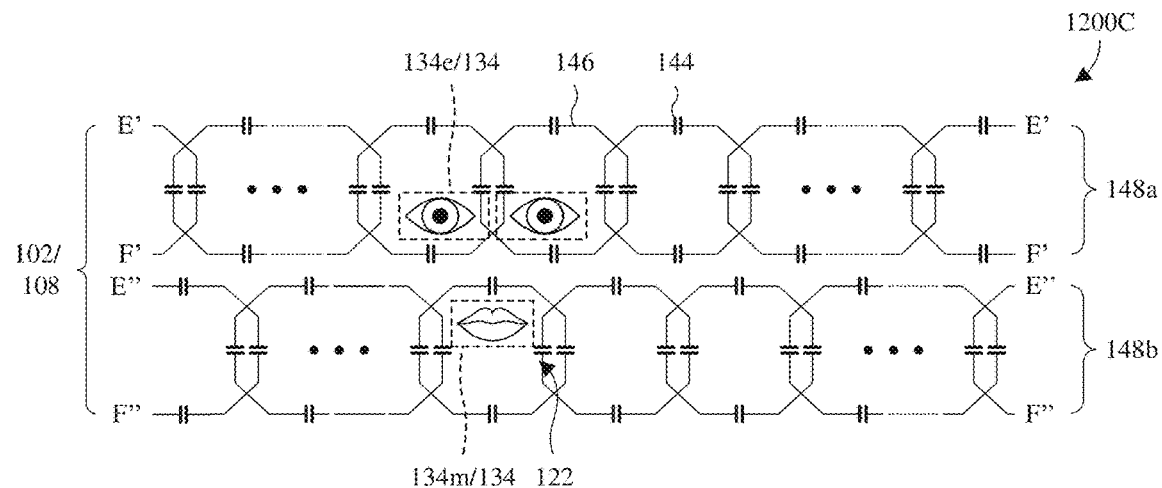
Figure 12D:
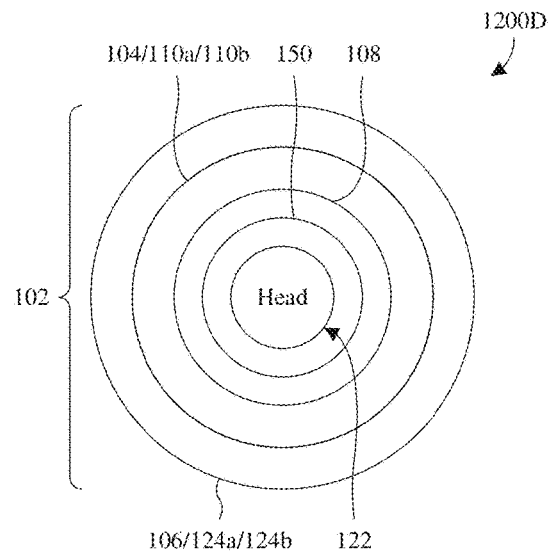
Figure 13A:
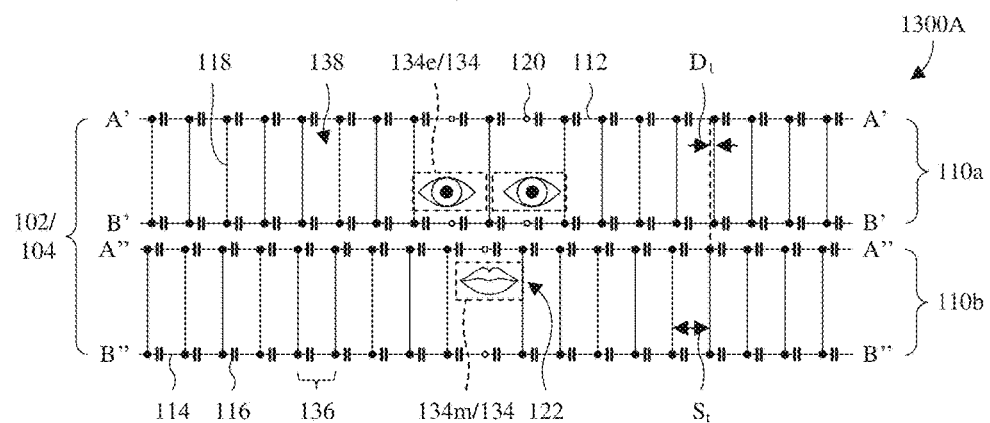
FIGS. 13A-13D illustrate various schematic views of some embodiments of the MRI head coil of FIGS. 12A-12D in which the open shield and the transmit coil have 17-rung and 18-rung birdcage coils and the phased array coil has a pair of 6-loop rows.
Figure 13B:
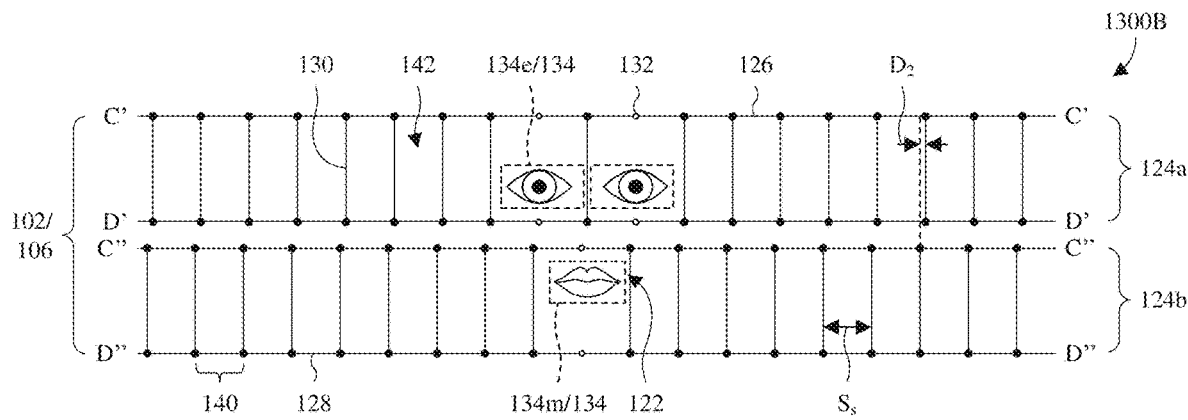
Figure 13C:
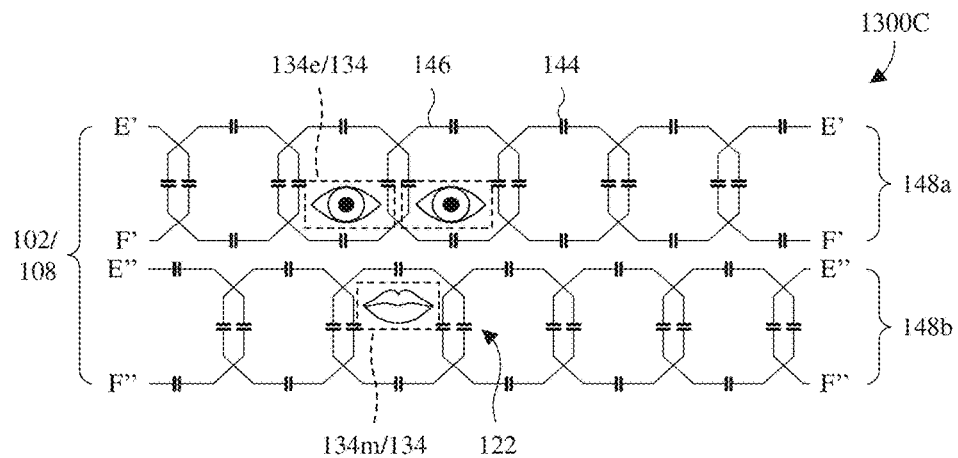
Figure 13D:
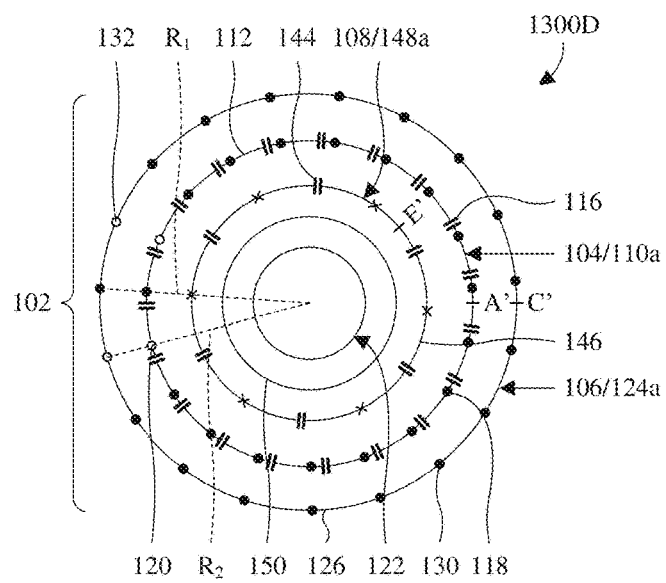

With reference to FIGS. 11A and 11B, various schematic views 1100A, 1100B of some alternative embodiments of the MRI head coil 102 of FIGS. 4A-4D is provided in which the transmit birdcage structure 110 and the shield birdcage structure 124 have 28 rungs and in which the transmit birdcage structure 110 and the shield birdcage structure 124 have two rungs removed at each of the eye opening 134e. Hence, the transmit birdcage structure 110 and the shield birdcage structure 124 have more rungs, and further have more rungs removed, compared to their counterparts in the MRI head coil 102 of FIGS. 4A-4D. In some embodiments, the transmit birdcage structure 110 has the cross-sectional $B_1$ magnetic field map 200C of FIG. 2C.

With reference to FIGS. 12A-12D, various schematic views 1200A-1200D of some alternative embodiments of the MRI head coil 102 of FIGS. 1A-1D is provided in which the transmit coil 104 has a pair of transmit birdcage structures 110a, 110b, the open shield 106 has a pair of shield birdcage structures 124a, 124b, and the phased array receive coil 108 has a pair of rows 148a, 148b is provided. The schematic views 1200A-1200D of FIGS. 12A-12D correspond to the schematic views 100A-100D of FIGS. 1A-1D.

The pair of transmit birdcage structures 110a, 110b comprises a first transmit birdcage structure 110a and a second transmit birdcage structure 110b. The transmit birdcage structures 110a, 110b are each as the transmit birdcage structure 110 of FIGS. 1A-1D is illustrated and described, except that the transmit birdcage structures 110a, 110b may have different configurations of transmit rungs 118 and/or may have different configurations of removed transmit rungs at the locations 120.

In some embodiments, the transmit rungs 118 of the first transmit birdcage structure 110a and the locations 120 of the first transmit birdcage structure 110a are evenly spaced with a pitch, and the transmit rungs 118 of the second transmit birdcage structure 110b and the locations 120 of the second transmit birdcage structure 110b are evenly spaced with the pitch. In some embodiments, the transmit rungs 118 of the first transmit birdcage structure 110a are laterally and respectively offset from neighboring transmit rungs 118 of the second transmit birdcage structure 110b by a first distance $D_1$. In alternative embodiments, the transmit rungs 118 of the first transmit birdcage structure 110a are aligned respectively with the neighboring transmit rungs 118 of the second transmit birdcage structure 110b, such that the first distance $D_1$ is zero.

Because the transmit birdcage structures 110a, 110b are in close proximity, the transmit birdcage structures 110a, 110b are coupled together by mutual inductance. As a result, the uniform mode frequency for the transmit birdcage structures 110a, 110b will split into two frequencies: a higher frequency; and a lower frequency. Any one of these two frequencies may then be used as a new uniform mode frequency. Further, so long as the new uniform mode frequency is the working frequency, the transmit birdcage structures 110a, 110b will work together as a single birdcage structure to create a common $B_1$ magnetic field. The two frequencies vary depending on overlap between the transmit birdcage structures 110a, 110b and upon the specific configurations of the transmit birdcage structures 110a, 110b.

The pair of shield birdcage structures 124a, 124b comprises a first shield birdcage structure 124a and a second shield birdcage structure 124b. The shield birdcage structures 124a, 124b are individual to and respectively surround the transmit birdcage structures 110a, 110b to contain radiation emitted by the transmit birdcage structures 110a, 110b and to reduce radiation loss. The shield birdcage structures 124a, 124b have the same structures respectively as the transmit birdcage structures 110a, 110b, except that the shield birdcage structures 124a, 124b have larger diameters and are devoid of capacitors for resonance (except for DC block capacitors to block gradient eddy current). Further, the shield birdcage structures 124a, 124b are each as the shield birdcage structure 124 of FIGS. 1A-1D is illustrated and described, except that the shield birdcage structures 124a, 124b may have different configurations of shield rungs 130 and/or may have different configurations of removed transmit rungs at the locations 132.

In some embodiments, the shield rungs 130 of the first shield birdcage structure 124a and the locations 132 of the first shield birdcage structure 124a are evenly spaced with a pitch, and the shield rungs 130 of the second shield birdcage structure 124b and the locations 132 of the second shield birdcage structure 124b are evenly spaced with the pitch. In some embodiments, the shield rungs 130 of the first shield birdcage structure 124a are laterally and respectively offset from neighboring shield rungs 130 of the second shield birdcage structure 124b by a second distance $D_2$. In alternative embodiments, the shield rungs 130 of the first shield birdcage structure 124a are aligned respectively with the neighboring shield rungs 130 of the second shield birdcage structure 124b, such that the second distance $D_2$ is zero.

The phased array receive coil 108 is as described and illustrated in FIGS. 1A-1D, except that the loops 146 of the phased array receive coil 108 are arranged in multiple rows: a first row 148a; and a second row 148b. Further, the rows 148a, 148b are non-overlapping, but may alternatively be overlapping. Note that the loops 146 may each include individual circuits (not shown). The circuits may, for example, be or include decoupling circuits, preamplifiers, and/or other suitable circuitry. In alternative embodiments, the phased array receive coil 108 has a single row as in FIGS. 1A-1D. Further, in alternative embodiments, the phased array receive coil 108 has more than two rows.

While FIGS. 12A-12D are described together, each of FIGS. 12A-12D may stand alone from one, some, or all of the remaining figures in alternative embodiments. While FIGS. 12A-12D illustrate the MRI head coil 102 with multiple openings 134, there may be more or less openings in alternative embodiments. While FIGS. 12A-12D illustrate the transmit birdcage structures 110a, 110b and the shield birdcage structures 124a, 124b each with two removed rungs, more or less rungs may be removed in alternative embodiments. While FIGS. 3A-3C are described with regard to FIGS. 1A-1D, it is to be appreciated that FIGS. 3A-3C are applicable to FIGS. 12A-12D. For example, the schematic view 1200D of FIG. 12D may, for example, be taken along line 302 in any of FIGS. 3A-3C and/or the schematic views 1200A-1200C of FIGS. 12A-12C may, for example, conform to any of the shapes of FIGS. 3A-3C. While FIG. 1C describes some embodiments of the phased array receive coil 108 in the MRI head coil 102 of FIGS. 1A-1D, these embodiments of the phased array receive coil 108 are also applicable to alternative embodiments of the MRI head coil 102 of FIGS. 12A-12D. In other words, the phased array receive coil 108 of FIGS. 12A-12D may alternatively be as in FIG. 1C.

With reference to FIGS. 13A-13D, various schematic views 1300A-1300D of some embodiments of the MRI head coil 102 of FIGS. 12A-12D are provided in which the transmit birdcage structures 110a, 110b and the shield birdcage structures 124a, 124b respectively have 17 and 18 rungs and in which the rows 148a, 148b of the phased array receive coil 108 have 6 loops 146. The schematic views 1300A-1300D of FIGS. 13A-13D correspond to the schematic views 1200A-1200D of FIGS. 12A-12D.

The transmit birdcage structures 110a, 110b respectively have 17 and 18 transmit rungs 118 and respectively have two transmit rungs and one transmit rung removed at the first locations 120. The two removed transmit rungs of the first transmit birdcage structure 110a are respectively at the eye openings 134e, and the single removed transmit rung of the second transmit birdcage structure 110b is at the mouth opening 134m. Similarly, the shield birdcage structures 124a, 124b respectively have 17 and 18 shield rungs 130 and respectively have two shield rungs and one shield rung removed at the second locations 132. The two removed shield rungs of the first shield birdcage structure 124a are respectively at the eye openings 134e, and the single removed shield rung of the second shield birdcage structure 124b is at the mouth opening 134m.

The first transmit birdcage structure 110a and the first shield birdcage structure 124a have the same total number of rungs and the same total number of removed rungs, and the second transmit birdcage structure 110b and the second shield birdcage structure 124b have the same total number of rungs and the same total number of removed rungs. The transmit rungs 118 of the first transmit birdcage structure 110a are radially aligned respectively with the shield rungs 130 of the first shield birdcage structure 124a, and the first locations 120 of the first transmit birdcage structure 110a are radially aligned respectively with the second locations 132 of the first shield birdcage structure 124a. For example, each of the transmit rungs 118 of the first transmit birdcage structure 110a neighbors a corresponding shield rung 130 of the first shield birdcage structure 124a along a first radial axis $R_1$ in FIG. 13D. As another example, each of the first locations 120 of the first transmit birdcage structure 110a neighbors a corresponding second location 132 of the first shield birdcage structure 124a along a second radial axis $R_2$ in FIG. 13D. The transmit rungs 118 of the second transmit birdcage structure 110b are radially aligned respectively with the shield rungs 130 of the second shield birdcage structure 124b, and the first locations 120 of the second transmit birdcage structure 110b are radially aligned respectively with the second locations 132 of the second shield birdcage structure 124b.

The phased array receive coil 108 has 6 loops 146 in each of the rows 148a, 148b. The loops 146 in each of the rows 148a, 148b overlap with neighboring loops in the corresponding rows to reduce mutual inductance. Further, the loops 146 are arranged around the openings 134, such that the loops 146 are wholly or partially outside the openings 134 and do not interfere with patient comfort. Note that the loops 146 may each include individual circuits, which are not shown for ease of illustration.

While FIGS. 13A-13D are described together, each of FIGS. 13A-13D may stand alone from one, some, or all of the remaining figures in alternative embodiments. While FIGS. 13A-13D illustrate the MRI head coil 102 with multiple openings 134, there may be more or less openings in alternative embodiments. While FIGS. 13A-13D illustrate the transmit birdcage structures 110a, 110b and the shield birdcage structures 124a, 124b each with two removed rungs, more or less rungs may be removed in alternative embodiments. While the FIGS. 13A-13D illustrate the transmit birdcage structures 110a, 110b and the shield birdcage structures 124a, 124b with specific numbers of rungs, more or less rungs are amenable in alternative embodiments.

Figure 14A:
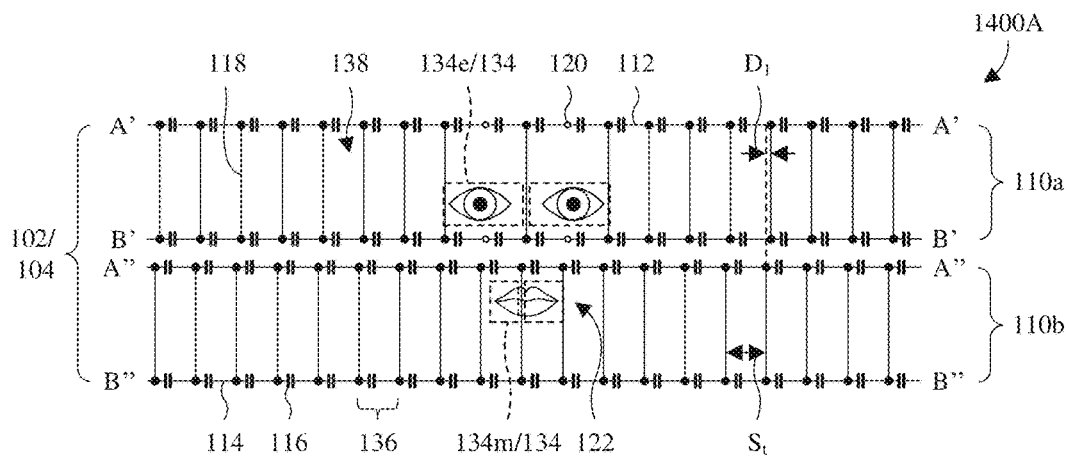
Figure 14B:
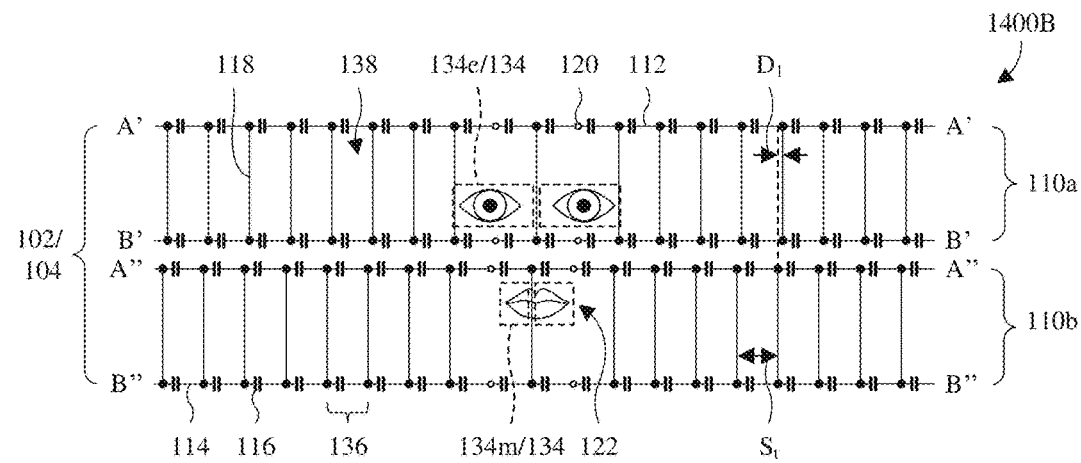
Figure 14C:
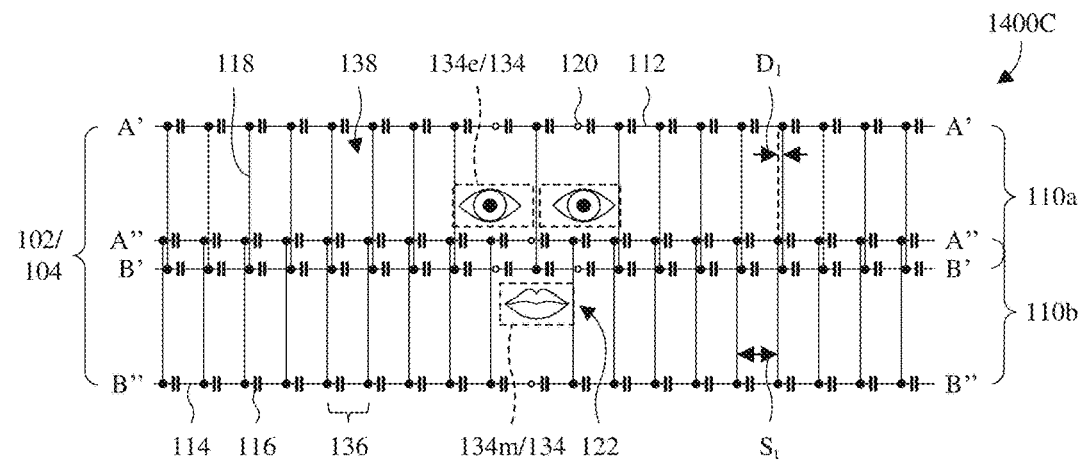
Figure 14D:
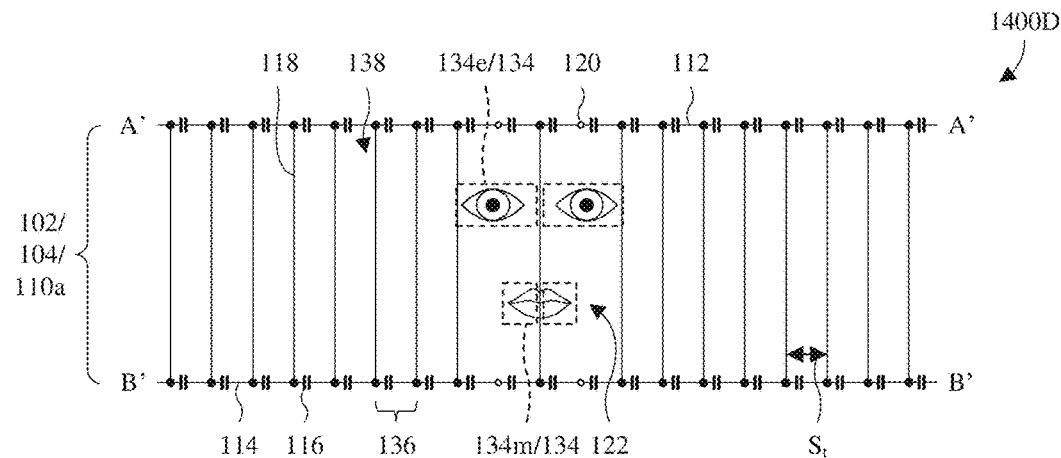
Figure 14E:
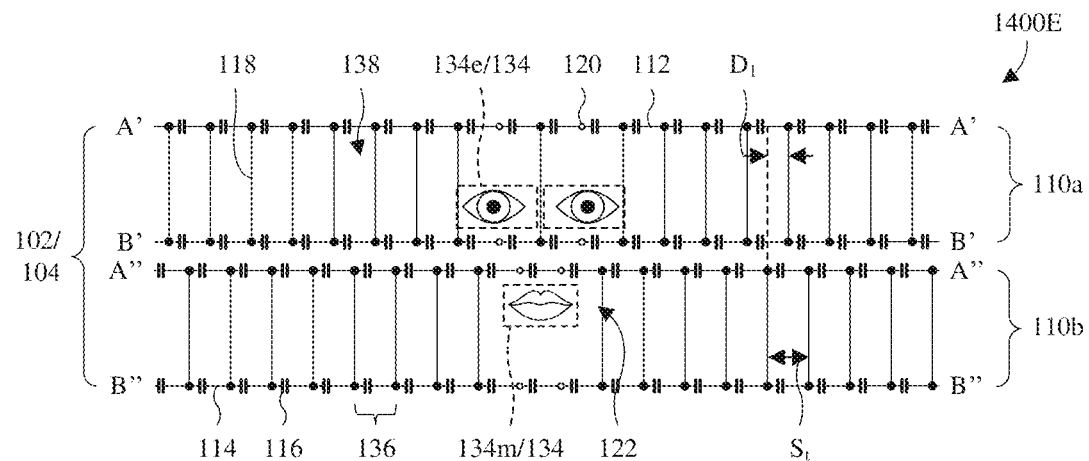
Figure 14F:
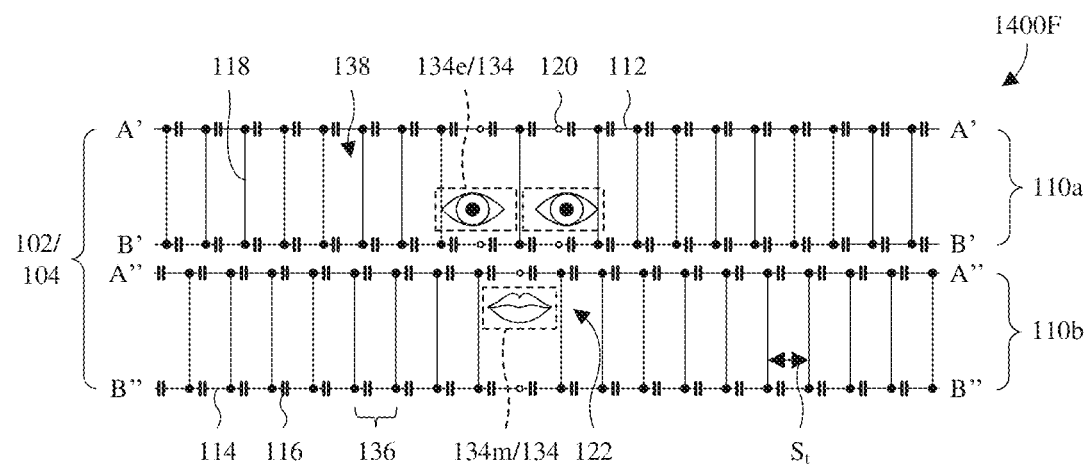
Figure 14G:
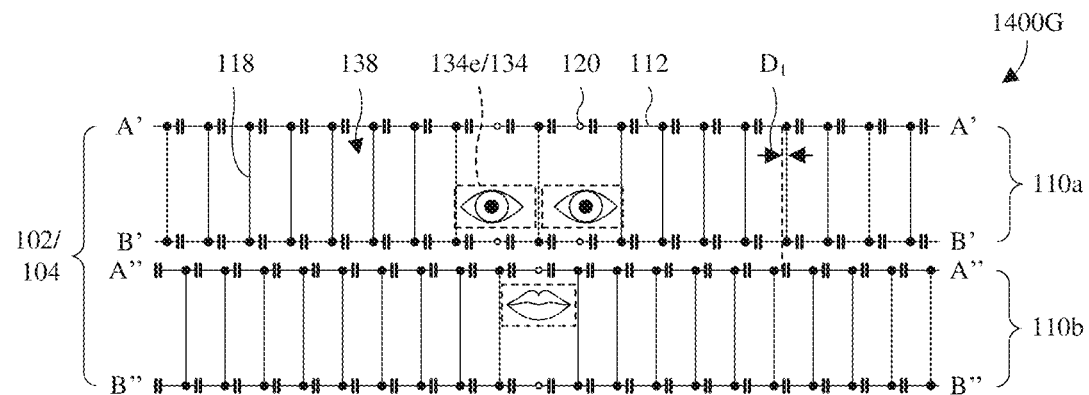

With reference to FIGS. 14A-14G, schematic views 1400A-1400G of some different alternative embodiments of the transmit coil 104 of FIGS. 13A-13D is provided. In FIG. 14A, the second transmit birdcage structure 110b has no transmit rungs removed. In FIG. 14B, the second transmit birdcage structure 110b has the same number of transmit rungs 118 as the first transmit birdcage structure 110a. Further, the second transmit birdcage structure 110b has two transmit rungs removed respectively at two mouth openings 134m. In FIG. 14C, the transmit birdcage structures 110a, 110b overlap. As described above, the amount of overlap controls a working frequency for the transmit coil 104. In FIG. 14D, the second transmit birdcage structure 110b is omitted and the openings 134 are localized to the first transmit birdcage structure 110a. In alternative embodiments, the first transmit birdcage structure 110a is omitted and the openings 134 are localized to the second transmit birdcage structure 110b. In FIG. 14E, the second transmit birdcage structure 110b has an additional transmit rung removed at the mouth opening 134m so the mouth opening 134m may be larger. Further, the second transmit birdcage structure 110b has the same number of rungs (e.g., 17 rungs) as the first transmit birdcage structure 110a. In FIG. 14F, the first transmit birdcage structure 110a has an additional transmit rung 118. In FIG. 14G, the second transmit birdcage structure 110b has an additional transmit rung 118.

Figure 15A:
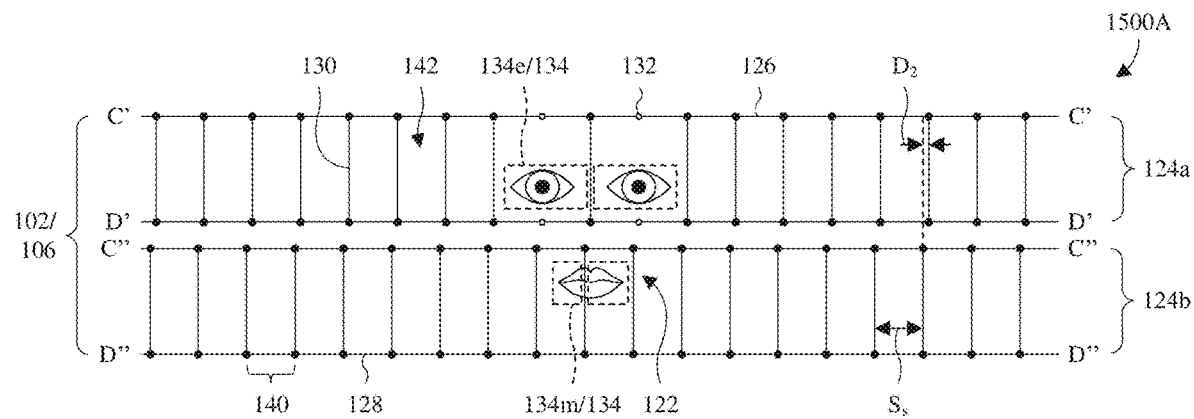
Figure 15B:
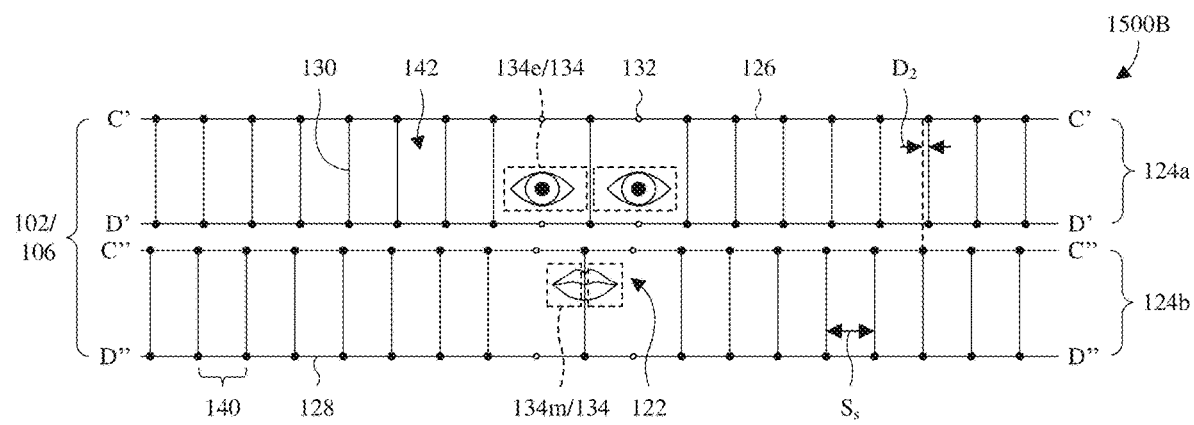
Figure 15C:
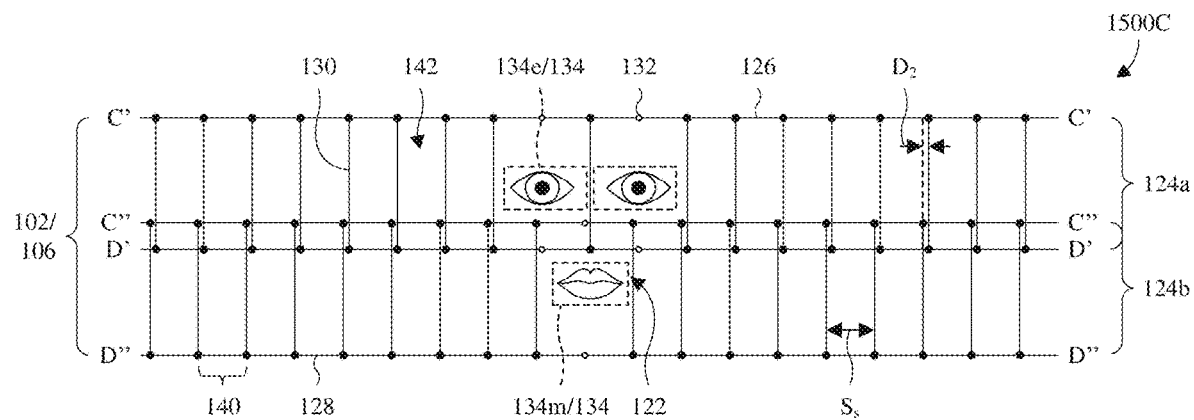
Figure 15D:
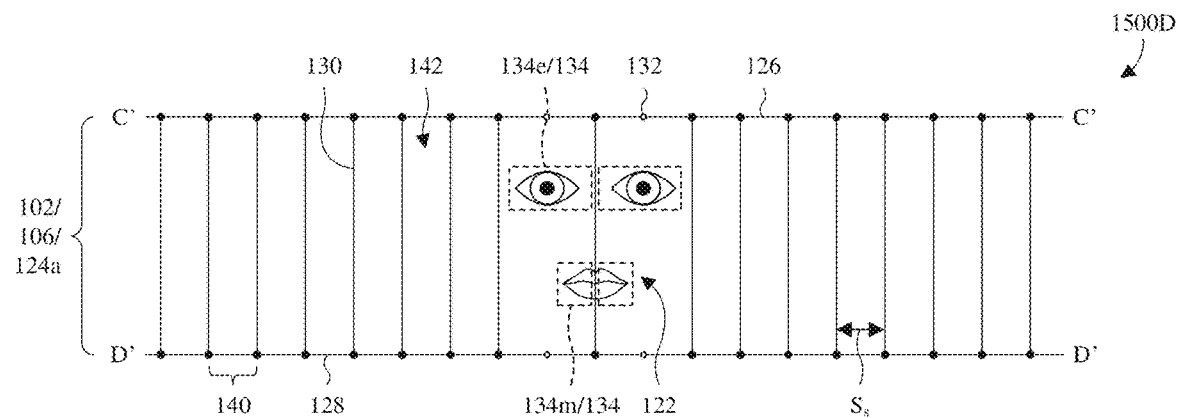
Figure 15E:
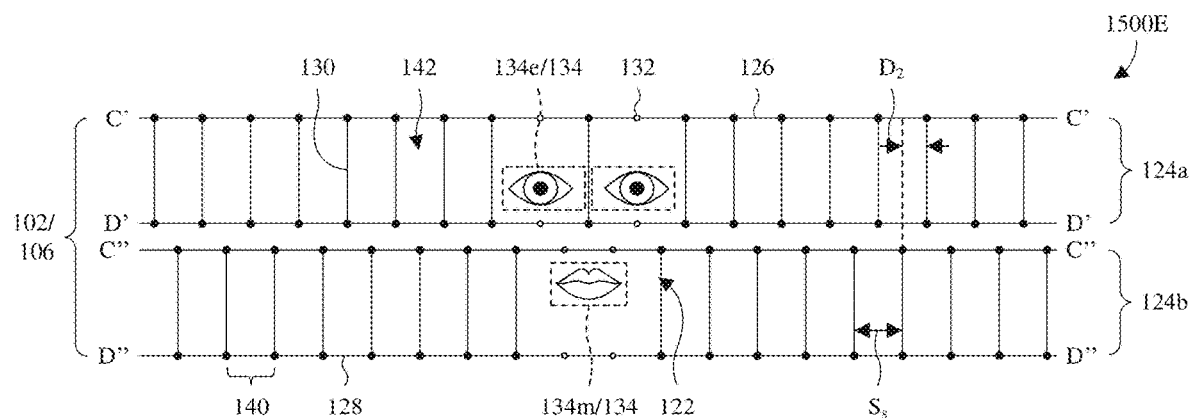
Figure 15F:
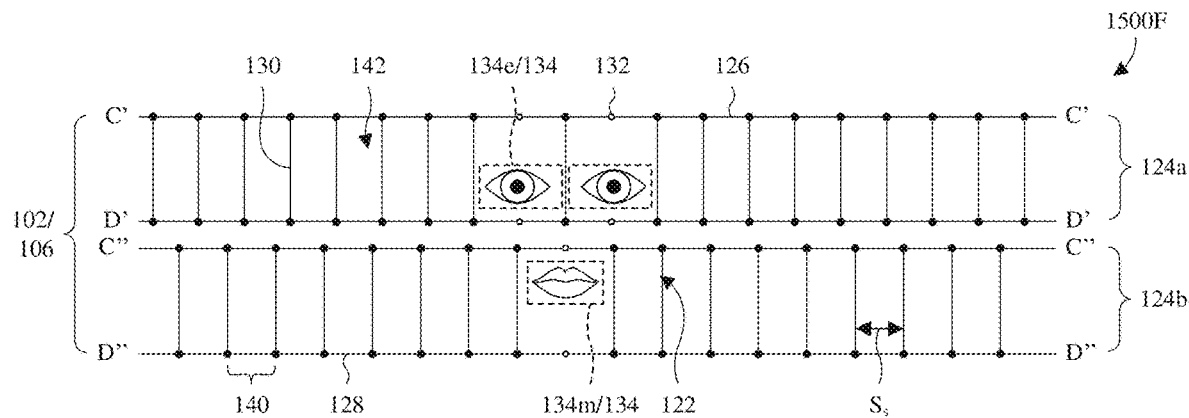
Figure 15G:
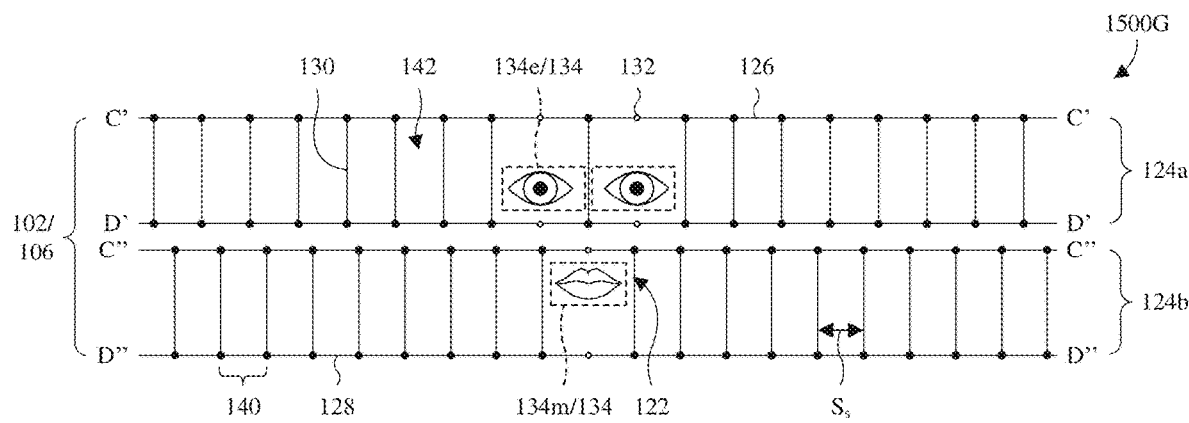

With reference to FIGS. 15A-15G, schematic views 1500A-1500G of some different alternative embodiments of the open shield 106 of FIGS. 13A-13D is provided. In FIG. 15A, the second shield birdcage structure 124b has no transmit rungs removed. In FIG. 15B, the second shield birdcage structure 124b has the same number of shield rungs 130 as the first shield birdcage structure 124a. Further, the second shield birdcage structure 124b has two shield rungs removed respectively at two small mouth openings 134m. In FIG. 15C, the shield birdcage structures 124a, 124b overlap. In FIG. 15D, the second shield birdcage structure 124b is omitted and the openings 134 are localized to the first shield birdcage structure 124a. In alternative embodiments, the first shield birdcage structure 124a is omitted and the openings 134 are localized to the second shield birdcage structure 124b. In FIG. 15E, the second shield birdcage structure 124b has an additional transmit rung removed at the mouth opening 134m. Further, the second shield birdcage structure 124b has the same number of rungs (e.g., 17 rungs) as the first shield birdcage structure 124a. In FIG. 15F, the first shield birdcage structure 124a has an additional shield rung 130. In FIG. 15G, the second shield birdcage structure 124b has an additional transmit rung 118.

With reference to FIGS. 16A-16C, schematic views 1600A-1600C of some different alternative embodiments of the phased array receive coil 108 of FIGS. 13A-13D is provided. In FIG. 16A, the rows 148a, 148b overlap to reduce mutual inductance. In FIG. 16B, the second row 148b has been removed. In alternative embodiments, the first row 148a is instead removed. In FIG. 16C, the rows 148a, 148b have different numbers of loops 146. Further, the loop 146 at the eye openings 134e is larger than a remainder of the loops 146.

While FIGS. 14A-14G, 15A-15G, and 16A-16C describe alternative embodiments of constituents in the MRI head coil 102 of FIGS. 13A-13D, it to be appreciated that these alternative embodiments may be mixed in any combination in alternative embodiments of the MRI head coil 102 of FIGS. 13A-13D. While FIGS. 4C and 7 describe some different embodiments of the phased array receive coil 108 in the MRI head coil 102 of FIGS. 4A-4D, the different embodiments of the phased array receive coil 108 are also applicable to alternative embodiments of the MRI head coil 102 of FIGS. 13A-13D. Further, while FIGS. 14A-14G and FIGS. 15A-15G respectively describe alternative embodiments of the transmit coils 104 and the open shields 106 separate from each other, FIGS. 14A-14G may be paired respectively with FIGS. 15A-15G in alternative embodiments of the MRI head coil 102 of FIGS. 13A-13D. For example, FIGS. 14A and 15A may be paired, FIGS. 14B and 15B may be paired, FIGS. 14C and 15C may be paired, FIGS. 14D and 15D may be paired, FIGS. 14E and 15E may be paired, FIGS. 14F and 15F may be paired, and FIGS. 14G and 15G may be paired.

With reference to FIGS. 17A-17D, various schematic views 1700A-1700D of some alternative embodiments of the MRI head coil 102 of FIGS. 1A-1D is provided in which the transmit coil 104 has three transmit birdcage structures 110a-110c, the open shield 106 has three shield birdcage structures 124a-124c, and the phased array receive coil 108 has three rows 148a-148c is provided. The schematic views 1700A-1700D of FIGS. 17A-17D correspond to the schematic views 100A-100D of FIGS. 1A-1D.

The three transmit birdcage structures 110a-110c comprise a first transmit birdcage structure 110a, a second transmit birdcage structure 110b, and a third transmit birdcage structure 110c. The transmit birdcage structures 110a-110c are each as the transmit birdcage structure 110 of FIGS. 1A-1D is illustrated and described, except that the transmit birdcage structures 110a-110c may have different configurations of transmit rungs 118 and/or may have different configurations of removed transmit rungs at the locations 120. In some embodiments, the transmit birdcage structures 110a-110c each have at least 17 transmit rungs 118.

Because the three transmit birdcage structures 110a-110c are in close proximity, the transmit birdcage structures 110a-110c are coupled together by mutual inductance. As a result, the uniform mode frequency for the transmit birdcage structures 110a-110c will split into multiple frequencies. Any one of these frequencies may be used as a new uniform mode frequency. Further, so long as the new uniform mode frequency is the working frequency, the transmit birdcage structures 110a-110c will work together as a single birdcage structure to create a common $B_1$ magnetic field. The frequencies vary depending on overlap between the transmit birdcage structures 110a-110c and upon the specific configuration of the transmit birdcage structures 110a-110c.

The three shield birdcage structures 124a-124c comprise a first shield birdcage structure 124a, a second shield birdcage structure 124b, and a third shield birdcage structure 124c. The shield birdcage structures 124a-124c respectively surround the transmit birdcage structures 110a-110c to contain radiation emitted by the transmit birdcage structures 110a-110c and to reduce radiation loss. The shield birdcage structures 124a-124c have the same structures respectively as the transmit birdcage structures 110a-110c, except that the shield birdcage structures 124a-124c have larger diameters and are devoid of capacitors for resonance (except for DC block capacitors to block gradient eddy current). Further, the shield birdcage structures 124a-124c are each as the shield birdcage structure 124 of FIGS. 1A-1D is illustrated and described, except that the shield birdcage structures 124a-124c may have different configurations of shield rungs 130 and/or may have different configurations of removed shield rungs at the locations 132.

The transmit birdcage structures 110a-110c and the shield birdcage structures 124a-124c have removed rungs at openings 134 extending through the MRI head coil 102. As described above, the openings 134 provide the patient 122 with enhanced comfort to alleviate claustrophobia. The openings 134 comprise a pair of eye openings 134e, a mouth opening 134m, and a nose opening 134n. The eye openings 134e are respectively at the first transmit birdcage structure 110a and the first shield birdcage structure 124a. The mouth opening 134m is at the third transmit birdcage structure 110c and the third shield birdcage structure 124c. The nose opening 134n is at the second transmit birdcage structure 110b and the second shield birdcage structure 124b.

The phased array receive coil 108 is as described and illustrated in FIGS. 1A-1D, except that the loops 146 of the phased array receive coil 108 are arranged in multiple rows: a first row 148a; a second row 148b; and a third row 148c. Further, the rows 148a-148c are non-overlapping, but may alternatively be overlapping. Note that the loops 146 may each include individual circuits (not shown). The circuits may, for example, be or include decoupling circuits, preamplifiers, and/or other suitable circuitry. In alternative embodiments, the phased array receive coil 108 has some other suitable configuration.

While FIGS. 17A-17D are described together, each of FIGS. 17A-17D may stand alone from one, some, or all of the remaining figures in alternative embodiments. While FIGS. 17A-17D illustrate the MRI head coil 102 with multiple openings 134, there may be more or less openings in alternative embodiments. While FIGS. 17A-17D illustrate the transmit birdcage structures 110a-110c and the shield birdcage structures 124a-124c with specific numbers of removed rungs, more or less rungs may be removed in alternative embodiments. While FIGS. 3A-3C are described with regard to FIGS. 1A-1D, it is to be appreciated that FIGS. 3A-3C are applicable to FIGS. 17A-17D. For example, the schematic view 1700D of FIG. 17D may, for example, be taken along line 302 in any of FIGS. 3A-3C. While FIGS. 1C and 12C describe some embodiments of the phased array receive coil 108 in the MRI head coil 102 of FIGS. 1A-1D, the embodiments of the phased array receive coil 108 are also applicable to alternative embodiments of the MRI head coil 102 of FIGS. 17A-17D.

While the figures heretofore describe the transmit coil 104 as comprising one to three transmit birdcage structures, the transmit coil 104 may more generally have one or more transmit birdcage structures. Each of the transmit birdcage structure(s) is surrounded by an individual shield birdcage structure, such that the open shield 106 has the same number of shield birdcage structures as there are transmit birdcage structures. The transmit birdcage structure(s) and the shield birdcage structure(s) are as their counterparts are described above. While the figures heretofore describe the MRI head coil 102 as comprising a phased array receive coil 108 with one to three rows, the phased array receive coil 108 may more generally have one or more rows.

With reference to FIG. 18, a block diagram 1800 of some embodiments of an MRI system comprising an MRI head coil 102 with an open shield 106 is provided. The MRI head coil 102 may, for example, be as in any one or combination of FIGS. 1A-1D, 2A-2C, 3A-3C, 4A-4D, 5A-5E, 6A-6E, 7, 8, 9A, 9B, 10A, 10B, 11A, 11B, 12A-12D, 13A-13D, 14A-14G, 15A-15G, 16A-16C, and 17A-17D. The MRI system comprises a scanner 1802 in which a basic field magnet 1804 and a plurality of gradient coils 1806x-1806z are arranged.

The basic field magnet 1804 and the gradient coils 1806x-1806z are arranged around a bore 1808 of the scanner 1802, which receives a patient 122 and the MRI head coil 102 while arranged on the patient 122. The basic field magnet 1804 is electrically coupled to, and controlled in part by, a basic field magnet power supply 1810. The basic field magnet 1804 produces a $B_0$ magnetic field over the patient 122 and in a direction parallel with the transmit rungs 118 (see, e.g., FIG. 1A) of the transmit coil 104 and the shield rungs 130 (see, e.g., FIG. 1B) of the open shield 106. In some embodiments, the $B_0$ magnetic field strength is 7T or above, but other suitable $B_0$ magnetic field strengths are amenable. The plurality of gradient coils 1806x-1806z emit gradient magnetic fields to spatially encode MRI signals received from the patient 122. The plurality of gradient coils 1806x-1806z include an x-direction gradient coil 1806x, a y-direction gradient coil 1806y, and a z-direction gradient coil 1806z for spatially encoding the MRI signals respectively in the X direction, the Y direction, and the Z direction. The Z direction is parallel to the $B_0$ magnetic field produced by the basic field magnet 1804, whereas the X and Y directions are transverse to the $B_0$ magnetic field. In alternative embodiments, one or more of the gradient coils 1806x-1806z is/are omitted. The gradient coils 1806x-1806z are electrically coupled to, and controlled in part, by a gradient coil power supply 1812.

The scanner 1802 is devoid of a built-in transmit coil, such that MRI depends upon a transmit coil 104 of the MRI head coil 102. For example, the scanner 1802 may be devoid of a primary coil and/or a WBC. In alternative embodiments, the scanner 1802 has a primary coil and/or a WBC suitable for use as a built-in transmit coil. In such alternative embodiments, either the transmit coil 104 of the MRI head coil 102 or the built-in transmit coil of the scanner 1802 may be used for MRI. However, because the MRI head coil 102 is local and would hence be closer to the patient 122 than the built-in transmit coil, the MRI head coil 102 is preferred.

The MRI head coil 102 comprises the transmit coil 104, the open shield 106, and a phased array receive coil 108. The transmit coil 104 comprise or is otherwise associated with a transmit control circuit 1814. The transmit control circuit 1814 disables the transmit coil 104 when the MRI system operates in receive mode. The phased array receive coil 108 comprises or is otherwise associated with a decoupling circuit 1816. The decoupling circuit 1816 decouples the phased array receive coil 108 from the $B_1$ magnetic field when the MRI system operates in transmit mode. In some embodiments, the decoupling circuit 1816 comprises a decoupling unit for each individual loop and/or element of the phased array receive coil 108.

A transmit circuit 1818 and a receive circuit 1820 are electrically coupled to the MRI head coil 102. The transmit circuit 1818 is electrically coupled to and drives the transmit coil 104 to generate a $B_1$ magnetic field transverse to the $B_0$ magnetic field when the MRI system operates in transmit mode. For example, the transmit circuit 1818 may drive the transmit coils 104 to generate RF pulses at the Larmor frequency. The $B_1$ magnetic field excite protons in the patient 122, which causes to the protons to emit MRI signals. As described above, the decoupling circuit 1816 decouples the phased array receive coil 108 from the $B_1$ magnetic field during transmit mode. The receive circuit 1816 is electrically coupled to the phased array receive coil 108 and receives the MRI signals in response to excitation of the protons by the transmit coil 104. As describe above, the transmit control circuit 1814 disables the transmit coil 104 during receive mode.

The basic field magnet power supply 1810, the gradient coil power supply 1812, the transmit circuit 1818, or any combination of the foregoing is/are controlled by a control device 1822. An imaging device 1824 receives MRI signals from the receive circuit 1820 and, in embodiments, receives control signals from the control device 1822. Based thereon, the imaging device 1824 generates an image of the patient 122 and outputs the image to a display device 1826. The imaging device 1824 generates the image by performing a transformation process on the MRI signals, such as, for example, a two-dimensional fast Fourier transform (FFT) or some other suitable transform. The control device 1822 may, for example, be a general-purpose device (e.g., a computer) executing instructions or an application-specific device. Similarly, the imaging device 1824 may, for example, be a general-purpose device (e.g., a computer) executing instructions or an application-specific device. While the control device 1822 and the imaging device 1824 are shown as being separate, the control device 1822 and the imaging device 1824 may be integrated together in alternative embodiments.

With reference to FIG. 19, a flow chart 1900 of some embodiments of a method for performing an MRI process using an MRI head coil with an open shield is provided. The MRI head coil 102 may, for example, be configured as in any one or combination of FIGS. 1A-1D, 2A-2C, 3A-3C, 4A-4D, 5A-5E, 6A-6E, 7, 8, 9A, 9B, 10A, 10B, 11A, 11B, 12A-12D, 13A-13D, 14A-14G, 15A-15G, 16A-16C, and 17A-17D. Further, the MRI process may, for example, be performed by the MRI system of FIG. 18 or some other suitable MRI system.

At 1902, the MRI head coil is provided. The MRI head coil comprises a phased array receive coil, a transmit coil, and an open shield, wherein the transmit coil is between the phased array receive coil and the open shield, and wherein the transmit coil and the open shield have birdcage structures with removed rungs. See, for example, the MRI head coil 102 of FIGS. 1A-1D in which the transmit coil 104 has removed transmit rungs at first locations 120 and the open shield 106 has removed shield rungs at second locations 132.

At 1904, the MRI head coil is arranged on a head of a patient, wherein the removed rungs of the transmit coil and the open shield are oriented at eyes of the patient to allow large openings through the MRI head coil at the eyes of the patient. In some embodiments, the removed rungs of the transmit coil and the open shield are also oriented at other features on the head of the patient to allow large openings through the MRI head coil at the other features. The other features may, for example, include a mouth, a nose, ears, and so on. Due to the large openings through the MRI head coil, patient comfort is increased and claustrophobia is reduced. See, for example, the MRI head coil 102 and the patient 122 in FIG. 18.

At 1906, the MRI head coil and the patient are arranged within an MRI scanner. See, for example, the scanner 1802 of FIG. 18.

At 1908, a $B_0$ magnetic field is applied to the head of the patient to align protons spinning in the head to the $B_0$ magnetic field. The $B_0$ magnetic field may, for example, be applied by the basic field magnet 1804 of FIG. 18 and the basic field magnet power supply 1810 of FIG. 18. In some embodiments, the $B_0$ magnetic field has a magnetic field strength of 7T or more, but other suitable magnetic field strengths are amenable.

At 1910, gradient fields are applied to the head of the patient to select a slice of the head. The gradient fields may, for example, be applied by the gradient coils 1806x-1806z of FIG. 18 and the gradient coil power supply 1812 of FIG. 18.

At 1912, a $B_1$ magnetic field is applied to the head of the patient using the transmit coil, wherein the $B_1$ magnetic field excites protons of the selected slice. The $B_1$ magnetic field may, for example, be applied by the transmit coil 104 of FIG. 18 and the transmit circuit 1818 of FIG. 18. Further, the phased array receive coil 108 may, for example, be decoupled from the B 1 magnetic field by the decoupling circuit 1816 of FIG. 18.

At 1914, MRI signals are received from the excited protons of the selected slice using the phased array receive coil. The MRI signals may, for example, be received by the phased array receive coil 108 of FIG. 18 and the receive circuit 1820 of FIG. 18. Further, the transmit coil 104, and hence each individual transmit birdcage structure of the transmit coil 104, may be disabled by the transmit control circuit 1814 of FIG. 18 while receiving the MRI signals.

At 1916, an image of the selected slice is generated using the received MRI signals. The image may, for example, be generated by the imaging device 1824 of FIG. 18 and/or may, for example, be displayed on the display device 1826 of FIG. 18.

While the flow chart 1900 of FIG. 19 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present disclosure provide a MRI head coil including: a phased array receive coil; a first transmit birdcage structure surrounding the phased array receive coil, wherein the first transmit birdcage structure includes a plurality of first transmit rungs spaced in a first closed path, and wherein inter-rung spacing at one or more first locations on the first closed path is greater than inter-rung spacing at a remainder of the first closed path; and a first shield birdcage structure surrounding the first transmit birdcage structure, wherein the first shield birdcage structure includes a plurality of first shield rungs spaced in a second closed path and elongated in a same direction as the first transmit rungs, wherein inter-rung spacing at one or more second locations on the second closed path is greater than inter-rung spacing at a remainder of the second closed path, and wherein the one or more second locations respectively border the one or more first locations. In some embodiments, the inter-rung spacing at the remainder of the first closed path is uniform, wherein the inter-rung spacing at the one or more first locations is an integer multiple of the inter-rung spacing at the remainder of the first closed path. In some embodiments, the first transmit birdcage structure is tuned to a Larmor frequency for 7T or above. In some embodiments, a total number of the first transmit rungs is greater than about 16. In some embodiments, the MRI head coil has one or more openings extending through the MRI head coil respectively at the one or more first locations and respectively at the one or more second locations, wherein the one or more openings extend through the MRI head coil transverse to a direction along which the first transmit and shield rungs are elongated. In some embodiments, the MRI head coil further includes a second transmit birdcage structure surrounding the phased array receive coil, wherein the second transmit birdcage structure includes a plurality of second transmit rungs spaced in a third closed path and elongated in parallel with the first transmit rungs, wherein inter-rung spacing at one or more third locations on the third closed path is greater than inter-rung spacing at a remainder of the third closed path, and wherein a total number of the one or more first locations is different than a total number of the one or more third locations. In some embodiments, the second transmit birdcage structure includes capacitors for resonance, wherein the MRI head coil further includes: a second shield birdcage structure surrounding the second transmit birdcage structure, wherein the second shield birdcage structure is the same as the second transmit birdcage structure except that the second shield birdcage structure is devoid of capacitors and is wider. In some embodiments, the total number of the one or more first locations is two and the total number of the one or more third locations is one, wherein the one or more third locations is between the one or more first locations.

In some embodiments, the present disclosure further provides an MRI system including an MRI head coil, wherein the MRI head coil includes: an open shield including a plurality of first shield grid segments bordering in a first closed path to define a first shield birdcage structure; a phased array receive coil; and a transmit coil between the phased array receive coil and the open shield, wherein the transmit coil includes a plurality of first transmit grid segments bordering in a second closed path to define a first transmit birdcage structure with rungs elongated in a same direction as rungs of the first transmit birdcage structure; wherein the first shield and transmit grid segments are ring shaped, wherein at least one of the first transmit grid segments is larger than a remainder of the first transmit grid segments, and wherein at least one of the first shield grid segments is larger than a remainder of the first shield grid segments and respectively borders the at least one of the first transmit grid segments. In some embodiments, the remainder of the first transmit grid segments have a first common size, wherein the remainder of the first shield grid segments have a second common size greater than the first common size. In some embodiments, the first transmit grid segments are each localized between two neighboring rungs of the first transmit birdcage structure. In some embodiments, the MRI system further includes an MRI scanner including a basic field magnet, wherein the MRI scanner is devoid of a transmit coil, and wherein the MRI head coil is in the MRI scanner. In some embodiments, the MRI system further includes an MRI scanner including a basic field magnet and accommodating the MRI head coil, wherein the MRI scanner is configured to generate a $B_0$ magnetic field in a direction parallel to rungs of the first transmit birdcage structure, and wherein the $B_0$ magnetic field is at least 7T. In some embodiments, the MRI head coil is cylindrical or dome shaped, wherein the first and second closed paths are circular and extend along a circumference of the MRI head coil.

In some embodiments, the present disclosure further provides a method for MRI including: providing an MRI head coil including: a phased array receive coil; a first transmit birdcage structure surrounding the phased array receive coil, wherein the first transmit birdcage structure includes multiple first transmit rungs; and a first shield birdcage structure surrounding the first transmit birdcage structure, wherein the first shield birdcage structure includes multiple first shield rungs elongated in a same direction as the first transmit rungs; wherein the first transmit rungs are evenly spaced in a first closed path but for one or more first locations on the first closed path, wherein the first shield rungs are evenly spaced in a second closed path but for one or more second locations on the second closed path, and wherein the one or more second locations respectively border the one or more first locations; arranging the MRI head coil on a patient, such that eyes of the patient respectively face the one or more first locations and respectively face the one or more second locations; and performing an MRI process on the patient using the MRI head coil, wherein the MRI process generates an image of the patient. In some embodiments, a total number of the first transmit rungs is greater than 16, wherein a total number of the first shield rungs is a same as the total number of the first transmit rungs, and wherein the MRI process is performed with a $B_0$ magnetic field that is 7T or above. In some embodiments, inter-rung spacing at the one or more first locations is greater than, and an integer multiple of, inter-rung spacing at a remainder of the first closed path. In some embodiments, the MRI head coil further includes a second transmit birdcage structure, wherein the second transmit birdcage structure includes multiple second transmit rungs elongated in a same direction as the first transmit rungs, wherein the second transmit rungs are evenly spaced in a third closed path but for one or more third locations along the third closed path, and wherein the MRI head coil is further arranged on the patient, such that a mouth of the patient faces the one or more third locations. In some embodiments, the MRI process includes a transmit mode and a receive mode, wherein the first transmit birdcage structure is disabled during the receive mode. In some embodiments, the MRI process includes a transmit mode and a receive mode, wherein the phased array receive coil is decoupled during the transmit mode.

The following includes definitions of selected terms employed herein. The definitions include various examples or forms of components that fall within the scope of a term and that may be used for implementation. The examples are not intended to be limiting. Both singular and plural forms of terms may be within the definitions.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which embodiments belong. It will be further understood that terms (e.g., those defined in commonly used dictionaries) should be interpreted as having a meaning that is consistent with their meaning in the context of the relevant art and will not be interpreted in an idealized or overly formal sense unless expressly so defined herein.

In the above description, some components may be displayed in multiple figures carrying the same reference signs but may not be described multiple times in detail. A detailed description of a component may then apply to that component for all its occurrences.

The detailed descriptions presented herein may be presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on refer to actions and processes of a computer system, logic, processor, or similar electronic device that manipulates and transforms data represented as physical and/or electronic quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

What is claimed is:

1. A magnetic resonance imaging (MRI) system comprising an MRI head coil, wherein the MRI head coil comprises:
    an open shield comprising a plurality of first shield grid segments bordering in a first closed path to define a first shield birdcage structure;
    a phased array receive coil;
    a transmit coil between the phased array receive coil and the open shield, wherein the transmit coil comprises a plurality of first transmit grid segments bordering in a second closed path to define a first transmit birdcage structure with rungs elongated in a same direction as rungs of the first shield birdcage structure; and
    a second transmit coil between the phased array receive coil and the open shield, wherein the second transmit coil comprises a plurality of second transmit grid segments bordering in a third closed path to define a second transmit birdcage structure with rungs elongated in a same direction as rungs of the first shield birdcage structure;
    wherein each of the first shield and transmit grid segments extends continuously around an opening through that grid segment, wherein at least one of the first transmit grid segments is larger than a remainder of the first transmit grid segments, wherein at least one of the first shield grid segments is larger than a remainder of the first shield grid segments and respectively borders the at least one of the first transmit grid segments, and wherein at least one of the second transmit grid segments is larger than a remainder of the second transmit grid segments.

2. The MRI system according to claim 1, wherein the remainder of the first transmit grid segments have a first common size, and wherein the remainder of the first shield grid segments have a second common size greater than the first common size.

3. The MRI system according to claim 1, wherein the first transmit grid segments are each localized between two neighboring rungs of the first transmit birdcage structure.

4. The MRI system according to claim 1, further comprising:
an MRI scanner comprising a basic field magnet, wherein the MRI scanner is devoid of a transmit coil, and wherein the MRI head coil is in the MRI scanner.

5. The MRI system according to claim 1, further comprising:
an MRI scanner comprising a basic field magnet and accommodating the MRI head coil, wherein the MRI scanner is configured to generate a $B_0$ magnetic field in a direction parallel to rungs of the first transmit birdcage structure, and wherein the $B_0$ magnetic field is at least 7 tesla.

6. The MRI system according to claim 1, wherein a total number of the at least one of the first transmit grid segments is different than a total number of the at least one of the second transmit grid segments.

7. A method for magnetic resonance imaging (MRI) comprising:
providing an MRI head coil comprising: a phased array receive coil; a first transmit birdcage structure surrounding the phased array receive coil, wherein the first transmit birdcage structure comprises multiple first transmit rungs; and a first shield birdcage structure surrounding the first transmit birdcage structure, wherein the first shield birdcage structure comprises multiple first shield rungs elongated in a same direction as the first transmit rungs; wherein the first transmit rungs are evenly spaced in a first closed path but for one or more first locations on the first closed path, wherein the first shield rungs are evenly spaced in a second closed path but for one or more second locations on the second closed path, and wherein the one or more second locations respectively border the one or more first locations;
arranging the MRI head coil on a patient, such that eyes of the patient respectively face the one or more first locations and respectively face the one or more second locations; and
performing an MRI process on the patient using the MRI head coil, wherein the MRI process generates an image of the patient;
wherein the one or more second locations comprise a first eye location and a second eye location separated by and bordering one of the first shield rungs, and wherein the MRI head coil is arranged on the patient such that the one of the first shield rungs is between the eyes of the patient.

8. The method according to claim 7, wherein a total number of the first transmit rungs is greater than 16, wherein a total number of the first shield rungs is a same as the total number of the first transmit rungs, and wherein the MRI process is performed with a $B_0$ magnetic field that is 7 tesla or above.

9. The method according to claim 7, wherein the MRI head coil further comprises a second transmit birdcage structure, wherein the second transmit birdcage structure comprises multiple second transmit rungs elongated in a same direction as the first transmit rungs, wherein the second transmit rungs are evenly spaced in a third closed path but for one or more third locations along the third closed path, and wherein the MRI head coil is further arranged on the patient, such that a mouth of the patient faces the one or more third locations.

10. The method according to claim 7, wherein the MRI process comprises a transmit mode and a receive mode, and wherein the first transmit birdcage structure is disabled during the receive mode.

11. The method according to claim 7, wherein the first transmit rungs are circumferentially arranged around a first axis extending in parallel with the first transmit rungs, wherein a second axis extends radially outward from the first axis, and wherein the second axis intersects one of the first transmit rungs and is spaced from each of the first shield rungs.

12. A magnetic resonance imaging (MRI) head coil comprising:
a phased array receive coil;
a first transmit birdcage structure surrounding the phased array receive coil, wherein the first transmit birdcage structure comprises a plurality of first transmit rungs spaced in a first closed path, and wherein inter-rung spacing at one or more first locations on the first closed path is greater than inter-rung spacing at a remainder of the first closed path; and
a first shield birdcage structure surrounding the first transmit birdcage structure, wherein the first shield birdcage structure comprises a plurality of first shield rungs spaced in a second closed path and elongated in a same direction as the first transmit rungs, wherein inter-rung spacing at one or more second locations on the second closed path is greater than inter-rung spacing at a remainder of the second closed path, and wherein the one or more second locations respectively border the one or more first locations.

13. The MRI head coil according to claim 12, wherein the inter-rung spacing at the remainder of the first closed path is uniform, and wherein the inter-rung spacing at the one or more first locations is an integer multiple of the inter-rung spacing at the remainder of the first closed path.

14. The MRI head coil according to claim 12, wherein the MRI head coil has one or more openings extending through the MRI head coil respectively at the one or more first locations and respectively at the one or more second locations, and wherein the one or more openings extend through the MRI head coil transverse to a direction along which the first transmit and shield rungs are elongated.

15. The MRI head coil according to claim 12, further comprising:
a second transmit birdcage structure surrounding the phased array receive coil, wherein the second transmit birdcage structure comprises a plurality of second transmit rungs spaced in a third closed path and elongated in parallel with the first transmit rungs, wherein inter-rung spacing at one or more third locations on the third closed path is greater than inter-rung spacing at a remainder of the third closed path, and wherein a total number of the one or more first locations is different than a total number of the one or more third locations.

16. The MRI head coil according to claim 15, wherein the second transmit birdcage structure comprises capacitors for resonance, and wherein the MRI head coil further comprises:
a second shield birdcage structure surrounding the second transmit birdcage structure, wherein the second shield birdcage structure is the same as the second transmit birdcage structure except that the second shield birdcage structure is devoid of capacitors and is bigger and configured to surround the second transmit birdcage structure.

17. The MRI head coil according to claim 15, wherein the total number of the one or more first locations is two and the total number of the one or more third locations is one, and wherein the one or more third locations is between the one or more first locations.

18. The MRI head coil according to claim 12, wherein a total number of the first transmit rungs is different than a total number of the first shield rungs.

19. The MRI head coil according to claim 12, further comprising:
   a former, wherein each of the phased array receive coil, the first transmit birdcage structure, and the first shield birdcage structure is arranged on and conforms to the former, and wherein the former is configured to be moved into and out of a bore of an MRI scanner concurrently with a patient to be imaged using the MRI head coil.

20. The MRI head coil according to claim 12, wherein the first transmit birdcage structure has a pair of end rings between which the first transmit rungs extend, wherein the pair of end rings comprises a first end ring extending continuously along an entirety of the first closed path in a two-dimensional (2D) plane, and wherein the 2D plane extends transverse to lengths of the first transmit rungs.

* * * * *